US009917221B2

United States Patent
Boriskina et al.

(10) Patent No.: US 9,917,221 B2
(45) Date of Patent: Mar. 13, 2018

(54) SOLAR POWER CONVERSION SYSTEM WITH DIRECTIONALLY- AND SPECTRALLY-SELECTIVE PROPERTIES BASED ON A REFLECTIVE CAVITY

(71) Applicant: Massachusetts Institute of Technology, Cambridge, MA (US)

(72) Inventors: Svetlana Boriskina, Winchester, MA (US); Daniel Kraemer, Providence, RI (US); Kenneth McEnaney, Cambridge, MA (US); Lee A. Weinstein, Cambridge, MA (US); Gang Chen, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 682 days.

(21) Appl. No.: 13/972,261

(22) Filed: Aug. 21, 2013

(65) Prior Publication Data
US 2014/0060604 A1    Mar. 6, 2014

Related U.S. Application Data

(60) Provisional application No. 61/697,478, filed on Sep. 6, 2012.

(51) Int. Cl.
*H01L 31/04* (2014.01)
*F24J 2/02* (2006.01)
(Continued)

(52) U.S. Cl.
CPC ............ *H01L 31/0406* (2013.01); *F24J 2/02* (2013.01); *F24J 2/07* (2013.01); *F24J 2/48* (2013.01);
(Continued)

(58) Field of Classification Search
CPC ..... H01L 31/0406; H02S 10/30; H02S 40/44; F24J 2002/003; F24J 2/02; F24J 2/07; F24J 2/48
See application file for complete search history.

(56) References Cited

U.S. PATENT DOCUMENTS

| 1,935,698 A | * | 11/1933 | Point | H01J 40/06 |
| | | | | 136/259 |
| 3,899,672 A | * | 8/1975 | Levi-Setti | F24J 2/10 |
| | | | | 126/648 |

(Continued)

FOREIGN PATENT DOCUMENTS

| WO | 01/96791 | 12/2001 |
| WO | 2009/105587 A2 | 8/2009 |

OTHER PUBLICATIONS

The Notification Concerning Transmittal of International Preliminary Report on Patentability for PCT/US2013/056386 dated Mar. 19, 2015.

(Continued)

*Primary Examiner* — Golam Mowla
(74) *Attorney, Agent, or Firm* — Sam Pasternack; MIT Technology Licensing Office

(57) ABSTRACT

Solar power conversion system. The system includes a cavity formed within an enclosure having highly specularly reflecting in the IR spectrum inside walls, the enclosure having an opening to receive solar radiation. An absorber is positioned within the cavity for receiving the solar radiation resulting in heating of the absorber structure. In a preferred embodiment, the system further contains an energy conversion and storage devices thermally-linked to the absorber by heat conduction, convection, far-field or near-field thermal radiation.

12 Claims, 30 Drawing Sheets

(51) Int. Cl.
  *H02S 10/30* (2014.01)
  *H02S 40/44* (2014.01)
  *F24J 2/07* (2006.01)
  *F24J 2/48* (2006.01)
  *F24J 2/00* (2014.01)

(52) U.S. Cl.
  CPC .............. *H02S 10/30* (2014.12); *H02S 40/44* (2014.12); *F24J 2002/003* (2013.01); *Y02E 10/41* (2013.01); *Y02E 10/60* (2013.01)

(56) References Cited

U.S. PATENT DOCUMENTS

| | | | | |
|---|---|---|---|---|
| 3,923,381 A * | 12/1975 | Winston | ............... | F24J 2/06 126/648 |
| 4,234,352 A * | 11/1980 | Swanson | ............... | F24J 2/07 136/253 |
| 4,251,291 A * | 2/1981 | Gomez | ............... | F24J 2/0494 126/618 |
| 4,313,024 A * | 1/1982 | Horne | ............... | F24J 2/07 136/246 |
| 4,337,759 A * | 7/1982 | Popovich | ............... | F24J 2/06 126/684 |
| 4,388,481 A * | 6/1983 | Uroshevich | ............... | F24J 2/07 136/246 |
| 4,419,532 A * | 12/1983 | Severns | ............... | F24J 2/07 136/253 |
| 4,960,468 A * | 10/1990 | Sinton | ............... | H02S 99/00 136/259 |
| 5,291,331 A | 3/1994 | Miano | | |
| 5,655,339 A * | 8/1997 | DeBlock | ............... | E04D 13/03 359/591 |
| 6,689,949 B2 * | 2/2004 | Ortabasi | ............... | H01L 31/052 136/244 |

OTHER PUBLICATIONS

The International Search Report for PCT/US2013/056386 dated Dec. 4, 2013.

* cited by examiner $$OC_{2D} = \frac{sin(\theta_a)}{sin(\theta_s)} \approx 18.7 \ (\theta_a = 5°)$$

$$OC_{3D} = \frac{sin^2(\theta_a)}{sin^2(\theta_s)} \approx 350 \ (\theta_a = 5°)$$

$$\eta_{optothermal} = \frac{Q_{useful}}{A_{ap} q_{sol}}$$

$$\eta_{ot} = \tau \alpha_{sol} \left( 1 - \frac{\sigma(T_{abs}^4 - T_{amb}^4)}{OC \cdot \tau \cdot \alpha_{sol}/\varepsilon_{eff} q_{sol}} \right)$$

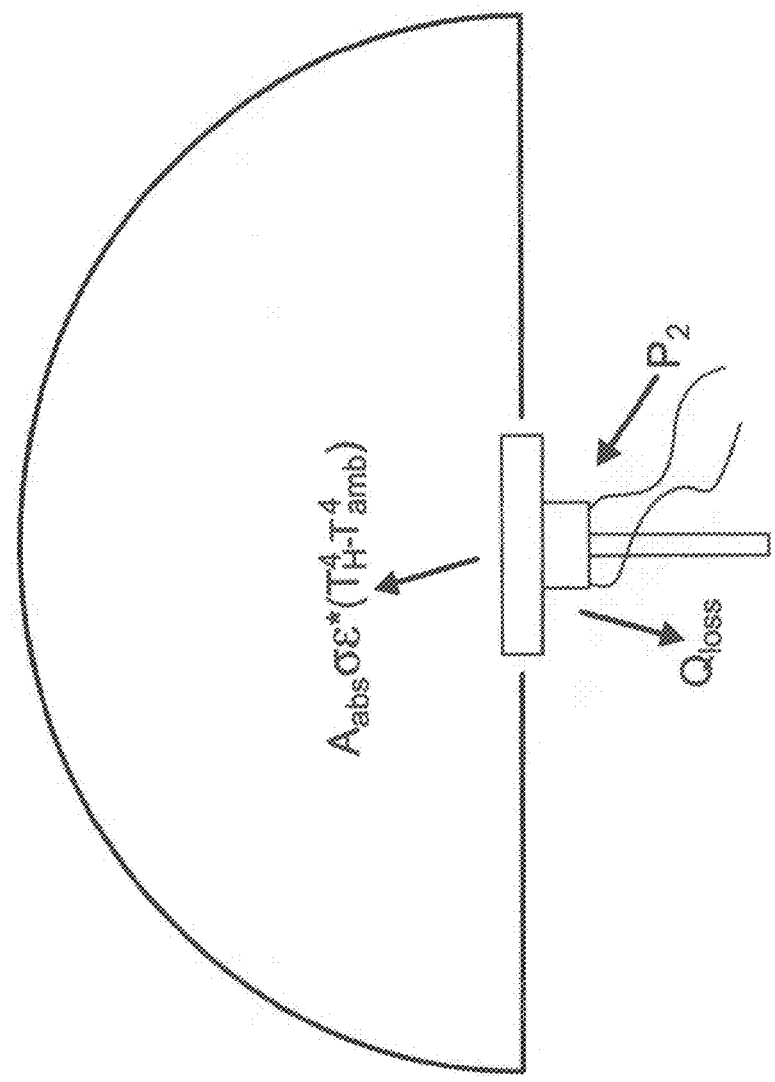
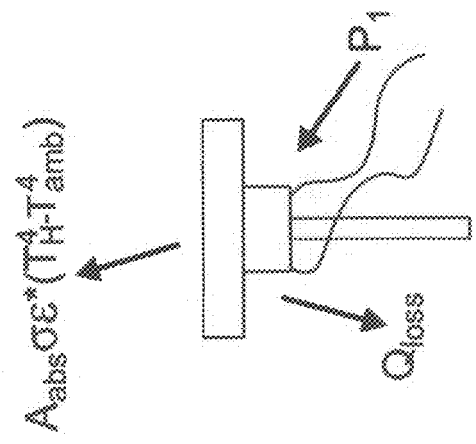
FIG. 12B
FIG. 12A

SOLAR POWER CONVERSION SYSTEM WITH DIRECTIONALLY- AND SPECTRALLY-SELECTIVE PROPERTIES BASED ON A REFLECTIVE CAVITY

This application claim priority to provisional application No. 61/697,478 filed on Sep. 6, 2012, the contents of which are incorporated herein by reference.

This invention was made with government support under Grant Nos. DE-EE0005320, DE-SC0001299 and DE-FG02-09ER46577 awarded by the Department of Energy. The government has certain rights in this invention.

BACKGROUND OF THE INVENTION

This invention relates to solar power and conversion and more particularly to a reflective surface surrounding a solar radiation intercepting surface.

Power generation from renewable energy sources must become significantly more prevalent if humanity is to continue expecting a high standard of living. Being the most abundant source of renewable energy, sunlight is often used as "fuel" in photovoltaic and solar-thermal energy conversion systems or in systems combining both system types. Solar photovoltaic systems directly convert the incident solar radiation into electricity; however, the solar cell also converts part of the solar energy into heat due to inherent cell irreversibility. Solar thermal energy conversion systems first convert the incident solar radiation into a terrestrial heat source. Depending on the application the heat can directly be used for residential space heating or to provide solar hot water or as commercial process heat. Additionally, the heat source can be combined with a heat engine such as indirect mechanical (e.g., conventional compression-expansion cycle) or direct power conversion units (e.g., thermophotovoltaic, thermoelectric, or thermionic converter).

A high power conversion unit efficiency of a solar thermal power conversion system can only be achieved if the solar receiver provides the heat to the heat engine at a high temperature. Consequently, the solar receiver needs to be raised to a high temperature, which requires a high solar receiver efficiency to maximize the overall system efficiency. This is not a trivial task, especially at high solar receiver temperatures, when the infrared (IR) radiation heat losses rise sharply (FIG. 1). The spectra of the energy flux of the thermal emission $q_{em}$ are strongly temperature-dependent and cover a longer wavelengths range than the incoming solar energy flux $q_{sol}=OC \cdot I_{AM1.5D}$ (OC is the solar concentration) [1]:

$$q_{em} = \pi \sin^2 \theta_{em} \int_0^\lambda \frac{2hc^2}{\lambda^5} \cdot \frac{\varepsilon(\lambda)}{(\exp(hc/\lambda k_B T_{abs})-1)} d\lambda, \quad (1)$$

where $T_{abs}$ is the absorber temperature, $k_B$ and h is the Boltzmann and Planck constants, respectively, $\theta_{em}$ is the angle (measured from the normal) within which the absorber emission is contained, and $\varepsilon(\lambda)$ is the average (over the emission angle) of the directional surface emittance as a function of wavelength. By Kirchhoff's law, $\theta_{em}$ is also the maximum angle within which the absorber can receive incoming solar radiation. For a directionally-isotropic solar receiver, $\theta_{em}=90°$ the spectral hemi-spherical receiver emittance $\varepsilon(\lambda)$ is equal to the spectral hemispherical receiver absorptance $\alpha(\lambda)$.

Traditionally, high solar receiver efficiencies have been achieved by using a blackbody surface to absorb the complete solar spectrum combined with large solar concentration [1], which helps to counteract radiative heat losses due to high IR emittance of the receiver (FIG. 1). Solar concentrating systems use mirrors or lenses to concentrate a large area of sunlight onto a small receiver area. Concentration of the sunlight increases the angle $\theta_i$ subtended by the sun at the absorber surface. The direct component of terrestrial sunlight (one sun, OC=1) is incident within $\theta_i=0.267°$ to the surface normal, and to achieve the maximum concentration of sunlight, $OC=\sin^{-2} \theta_i=46050$, the receiver must accept radiation in all directions ($\theta_{em}=90°$). An alternative way to improve the energy conversion efficiency is to suppress the IR radiative heat losses by using spectrally-selective surfaces that provide high absorption in the visible and near-IR but low emission in the far-IR [2]. Yet, another little explored path is using directionally-selective surfaces [2, 3], which can enable reaching high absorber temperature via suppressing emission at large angles $\theta > \theta_i$, which reduces radiative heat losses without affecting absorption of sunlight as long as the sunlight is incident with an angle to that subtended by the sun at the absorber surface $\theta_{em}=\theta_i$ is equivalent to the maximum concentration of the sunlight [4].

The top row of plots in FIG. 2 compares the effect of the control parameters discussed above, namely, solar concentration OC, emission angle $\theta_{em}$ and emission bandwidth $\lambda \in [0, \lambda_{em}]$ on the maximum temperature $T_{abs}$ to which the absorber can be raised. The temperature is calculated from the energy balance at thermal equilibrium $q_{sol}=q_{em}-q_{amb}$, assuming $T_{amb}=0$ (due to much lower temperature of the ambient) and a perfect mirror on the shadow side of the absorber. As expected, the increase of the solar concentration (top left) and reduction of the emission angle (top right) both result in the increase of the absorber temperature. Reduction of the emission bandwidth first leads to the temperature increase owing to suppression of the IR radiation losses (top center). The temperature eventually peaks in the visible before dropping again due to the reduced absorption of the incident sunlight. For the case of the directionally-selective surface, the effective emittance of the solar absorber is also plotted, which in this case is assumed to be frequency-independent ($\varepsilon(\lambda)=1$) yet angularly-selective: $\varepsilon_{eff}=\varepsilon \cdot \sin^2 \theta_{em}$. The bottom row in FIG. 2 shows the effect of the same parameters on the limiting detailed balance efficiency [5,6] of a single-junction PV cell.

The heat that is provided by the solar receiver to the heat engine for the conversion to electricity is limited by the incident solar intensity, optical concentration and the IR radiation heat loss which is dependent on the receiver temperature. The optothermal efficiency $\eta_{ot}$ [7] can be expressed as $$\eta_{ot} = \tau \alpha_{sol} \left( 1 - \frac{\sigma(T_{abs}^4 - T_{amb}^4)}{OC \cdot \tau \cdot \alpha_{sol}/\varepsilon_{eff} \cdot q_{sol}} \right). \quad (2)$$

Above, $\tau$ is the optical transmittance of the concentrator (e.g. lens), $\alpha_{sol}$ is the absorptance and $\varepsilon_{eff}$ the effective total hemispherical emittance of the solar absorber, and $\sigma$ is the Stefan-Boltzmann constant.

It should finally be noted that these control parameters can also be used to improve the efficiency of the conversion of solar energy into electricity via a photovoltaic (PV) cell as shown in the bottom row of FIG. 2. As will be discussed below, the three major channels of losses that limit the overall efficiency of the PV cell are the band-edge thermalization of charge carriers in the PV cell, the loss of low-energy photons that cannot generate electron-hole pairs, and emission losses due to radiative recombination of electron-hole pairs. FIG. 2 shows the efficiency of the single-junction PV cell as a function of the three control parameters, i.e., solar concentration (bottom left), PV cell surface spectral selectivity (bottom center) or PV cell surface angular selectivity (bottom right). As can be seem from these plots, similarly to the solar-thermal converter case shown in FIG. 1, either increase of the solar concentration or reduction of the directional emittance boost the PV cell conversion efficiency, while the efficiency as a function of the material bandgap peaks in the near-IR and drops off in shorter and longer wavelength ranges.

The disclosed solar receiver cavity is an example of the implementation of the third approach discussed above, namely, the introduction of a directional (or angular) selectivity of the absorber surface to reduce the effective IR emittance and thus to enable high optothermal receiver efficiencies at low optical concentration. Using angularly-selective surfaces to improve the performance of solar-thermal systems has been investigated in a number of papers [2, 3], although physical devices for actually achieving an angularly-selective surface has not been proposed. Angular selectivity using photonic crystals has been theoretically investigated for PV applications [8], however, with the goal to achieve better acceptance rather than to limit the emittance at larger angles. Furthermore, it would be highly desirable to find simpler, cheaper solutions than photonic crystals, which require sophisticated design and precise nanofabrication.

SUMMARY OF THE INVENTION

In a first aspect the invention is a solar power conversion system including a cavity formed within an enclosure having highly specularly reflective in the IR spectrum inside walls, the enclosure having an opening to receive solar radiation. An absorber is disposed within the cavity for receiving the solar radiation resulting in heating of the absorber structure. It is preferred that the IR spectrum include the emission IR spectrum of the absorber. The enclosure is preferred to have a spherical, ellipsoidal or cylindrical geometry. It is also preferred that the enclosure be maintained at a vacuum level. It is also preferred that the absorber be disposed proximate the center of the enclosure.

In a preferred embodiment, the absorber is highly absorptive to solar radiation but has a low emittance at is operational temperature. The absorber may be substantially a black body on at least a surface thereof that receives the solar radiation.

Yet another embodiment includes a device thermally linked to the absorber by heat conduction or thermal radiation. The device may be a thermoelectric generator, for example.

In a preferred embodiment of this aspect of the invention, photons above a band gap are directed toward the photovoltaic cell and photons below the band gap are directed toward the absorber. It is preferred that the absorber have a high absorbance and low emittance on a side receiving below-the-bandgap photos from the solar radiation.

BRIEF DESCRIPTION OF THE DRAWING

FIGS. 12a and b are schematic illustrations of an experimental procedure practiced herein.

DESCRIPTION OF THE PREFERRED EMBODIMENT

Figure 1:
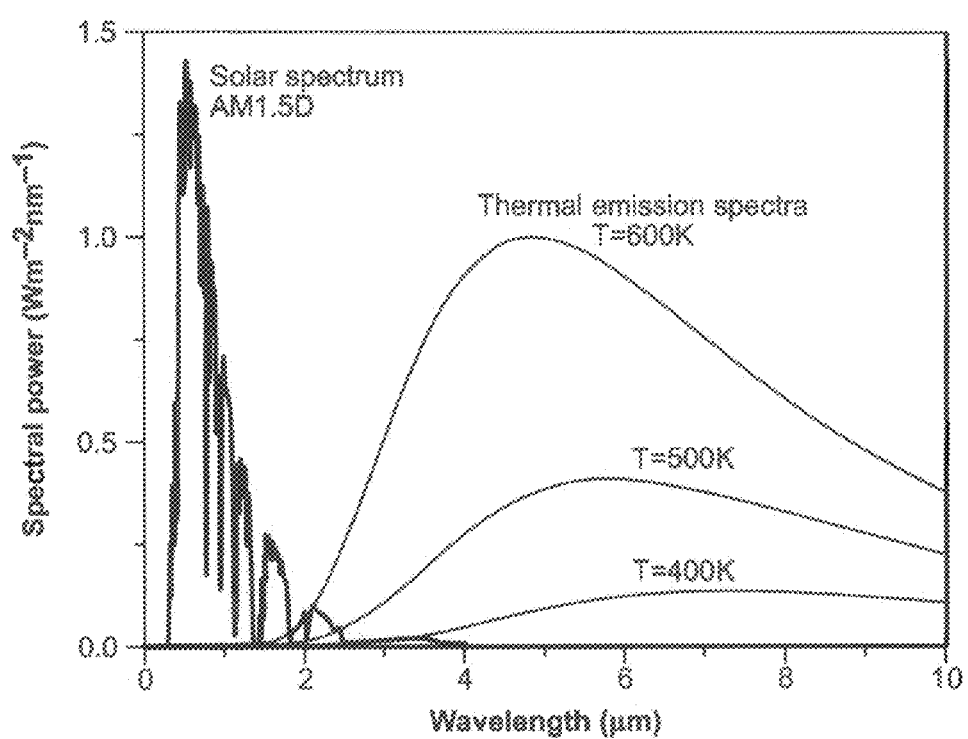
FIG. 1 is a graph of spectral power vs. wavelength for the spectrum of terrestrial solar radiation without optical concentration.
Figure 2:
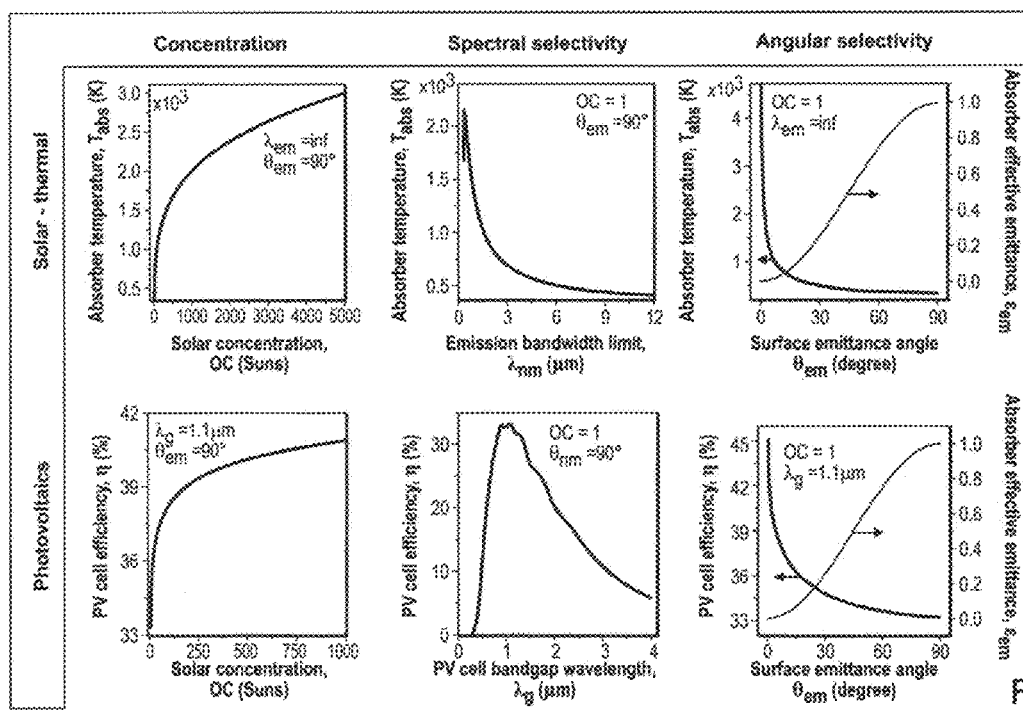
FIG. 2 comprises a aeries of graphs comparing the effect of control parameters such as solar concentration, emission angle and emission bandwidth on the maximum temperature to which an absorber can be raised.
Figure 3A:
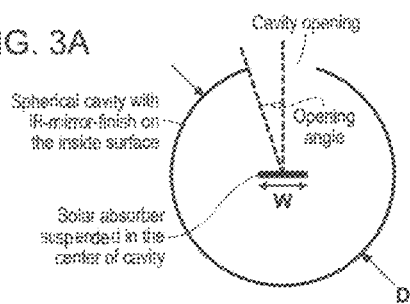
FIGS. 3a, b, c and d are schematic illustrations of the concept of a low-infrared emitting and high solar absorbing solar receiver cavity with an optical concentrator.
Figure 3B:
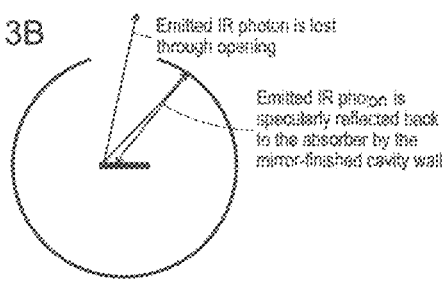
Figure 3C:
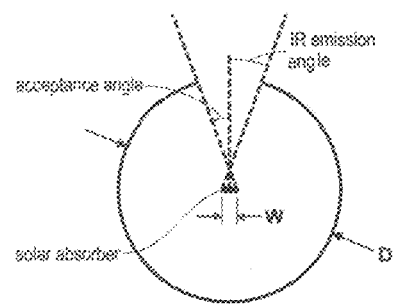
Figure 3D:
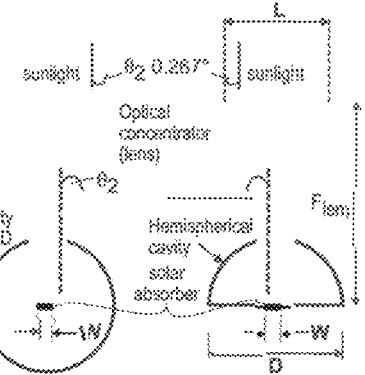

The solar receiver cavity according to an embodiment of the invention includes a spherical (or partially spherical), ellipsoidal (or partially ellipsoidal) or cylindrical (or partially cylindrical) vacuum enclosure with a solar absorber (blackbody or wavelength-selective surface) suspended in the center of the cavity (FIG. 3(a)). The inside walls of the cavity are highly specularly reflective in the IR spectrum of the emitting absorber. By using spherical/cylindrical geometries and placing the hot surface symmetrically at the center of the sphere/cylinder, any radiation emitted by the hot surface, other than that directly escaping the opening aperture, will be reflected back to the same hot surface. The only loss in the latter case will be the loss due to reflection of the inner surface of the sphere/cylinder. Therefore, the emitted radiation from the absorber is ideally back reflected on to and reabsorbed by the absorber resulting in reduced heat losses (FIG. 3(b)). The cavity has an opening with a specific acceptance angle allowing sunlight to enter the cavity with penalty of IR radiation heat losses through the opening (FIG. 3(c)). Thus, the IR emission angle is determined by the size of the absorber and the cavity and by the acceptance angle. For all following theoretical results the simulations were performed for a hemispherical/half-cylinder cavity design (FIG. 3(d) right design). It is also understood that the opening window can have coatings that is transmitting for part of solar spectral and reflecting for a large part of the emission spectrum of the hot surfaces, further reducing the radiation loss.

Figure 4A:
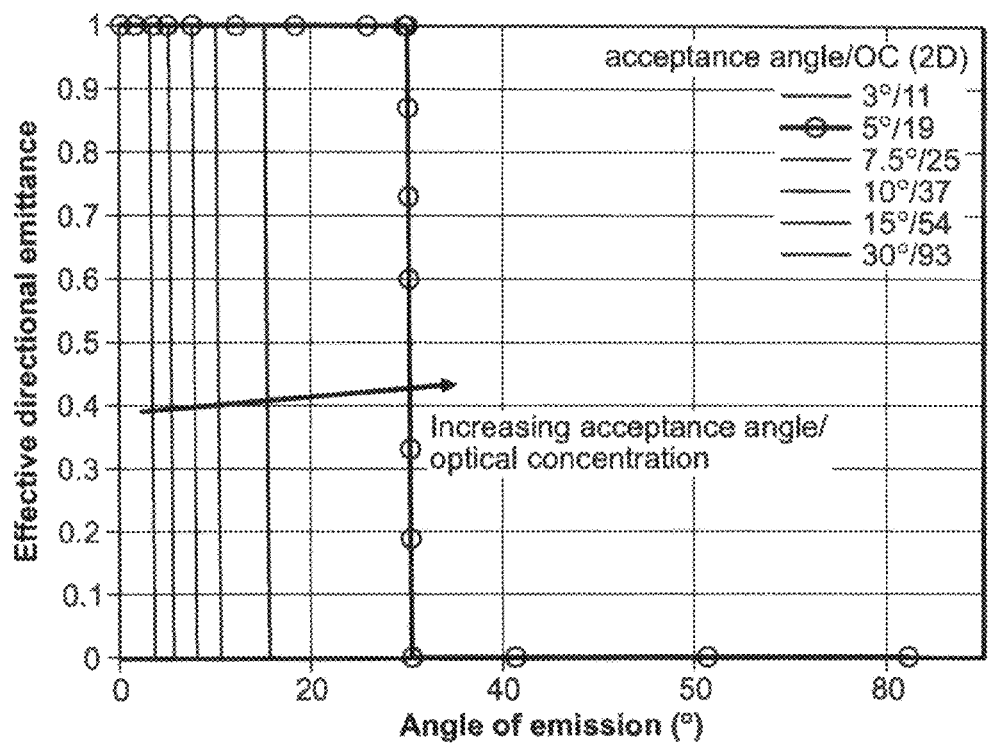
FIGS. 4a, b and c are graphs illustrating simulation results for a black body absorber surrounded by a half-cylinder perfect mirror cavity with a diameter 200 times larger than the absorber width showing the effect of the cavity acceptance angle.
Figure 4B:
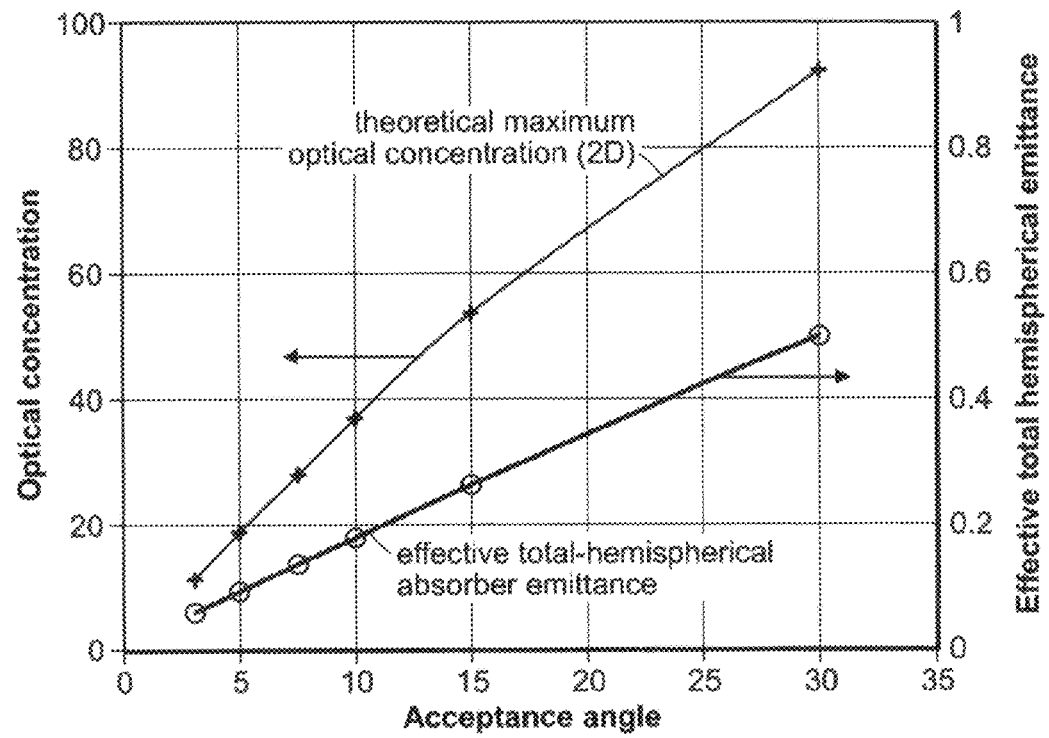
Figure 4C:
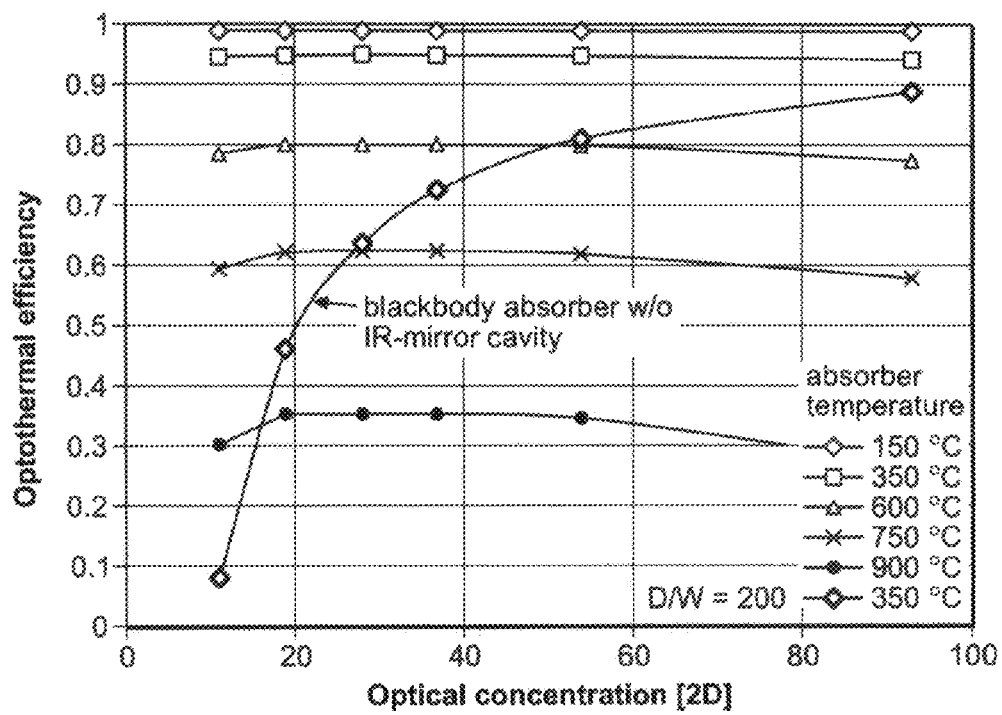

The acceptance angle determines the maximum optical concentration that can be used for the solar receiver cavity (equations in FIG. 4). The larger the acceptance angle of the cavity the larger is the maximum theoretical optical concentration (FIG. 4b). However, the effective hemispherical emittance of the absorber also increases with increasing acceptance angle (FIG. 4b). The larger the opening (acceptance angle) the smaller is the directional confinement for that IR emission from the absorber (FIG. 4a). This relation between the acceptance angle, the optical concentration, and the directional-selectivity of the IR emission results in a much weaker dependence of the optothermal efficiency (equation in FIG. 4) on the optical concentration compared to a solar absorber without a surrounding mirror cavity (FIG. 4c). Consequently, concentrating solar thermal systems based on our proposed solar receiver cavity design should require significantly smaller optics without a penalty in the optothermal and system efficiency.

FIG. 4 shows simulation results for a blackbody absorber surrounded by a half-cylinder prefect mirror cavity with a diameter 200 times larger than the absorber width showing the effect of the cavity acceptance angle. The effective directional emittances are obtained with a 2D Monte-Carlo Ray-Tracing method, the effective hemispherical emittances are determined by the cosine-weighted integration of the effective directional emittance over the polar angle, and the optothermal efficiency is calculated with the shown equation. As shown in FIG. 4a, the directional confinement of the IR emission decreases with increasing acceptance angle; the effective hemispherical absorber IR emission and the optical concentration increases with increasing acceptance angle as shown in FIG. 4b; and FIG. 4c shows that enclosing the solar absorber inside the mirror-cavity significantly boosts the optothermal efficiency even for low levels of optical concentration. Also shown are the correlations (2D, 3D) for the theoretical maximum optical concentration for a given sunlight divergence angle and cavity acceptance angle, and the equation for the optothermal efficiency. For the optothermal efficiency calculations a transmittance $\tau$ of 1, a solar absorptance $\alpha_{sol}$ of 0.95.

Figure 5A:
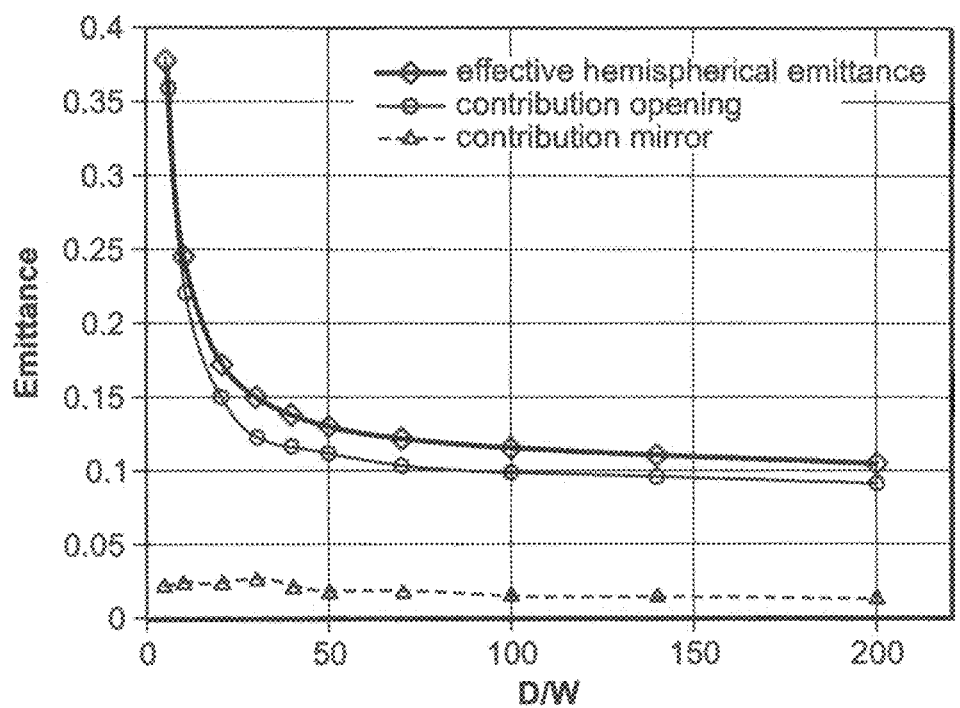
FIGS. 5a, b and c show simulation results for a black body absorber in the center of a half-cylinder metal cavity accounting for finite IR absorbance of metal walls.
Figure 5A:
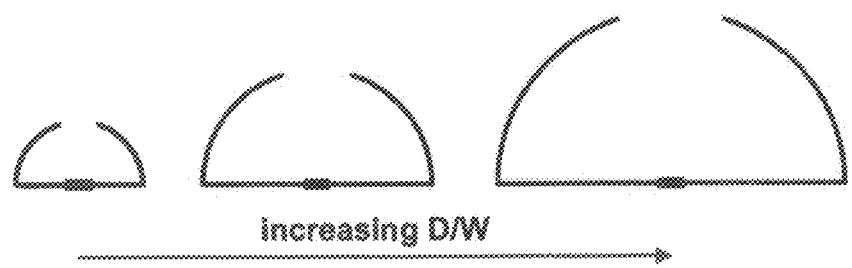
Figure 5B:
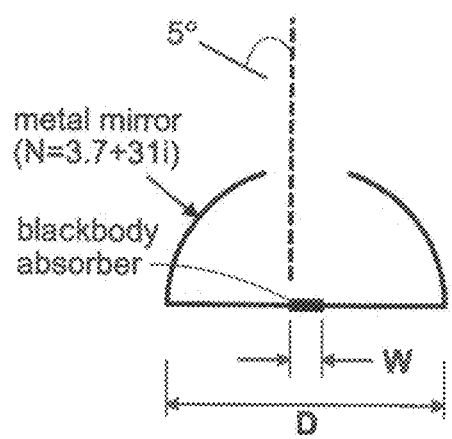
Figure 5C:
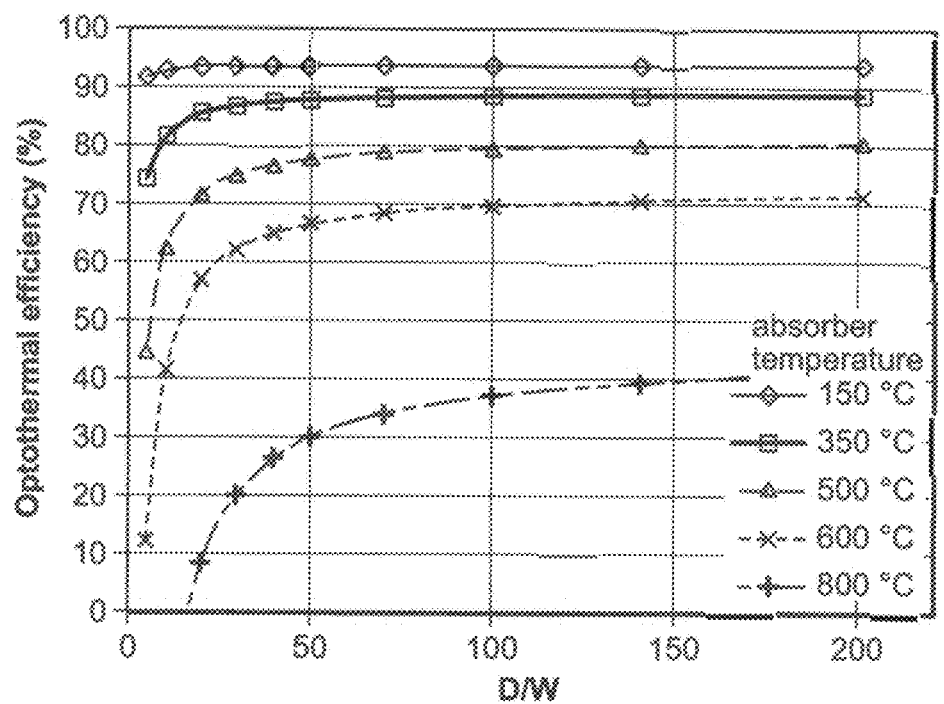

In the case of a 2D (half-cylinder) solar receiver cavity a lot of IR radiation emitted by the absorber can still escape through the opening. Even for the ideal geometry when the diameter D of the cavity is much larger than the width W of the absorber the effective hemispherical emittance stays above 10% (FIG. 5a). Increasing ratio D/W reduces the contribution to the radiation heat loss. In the ideal case of infinite D/W value, the photons emitted towards but not absorbed by the cavity walls, would be back reflected and reabsorbed by the absorber. For smaller values of D/W, more photons will miss the absorber after the reflection at the cavity walls which increases the chance of them either being absorbed by the metal or leaving through the opening. With the limited 2D directional IR emission confinement the achievable optothermal efficiencies of the cavity are still relatively low especially at higher absorber temperatures (FIG. 5c) mainly due to the large heat loss through the opening. Two design modifications can potentially lead to much improved performance of the solar receiver cavity: (a) a 3D confinement with a spherical mirror cavity and/or (b) replacement of the blackbody absorber with a wavelength-selective solar absorber.

Figure 6A:
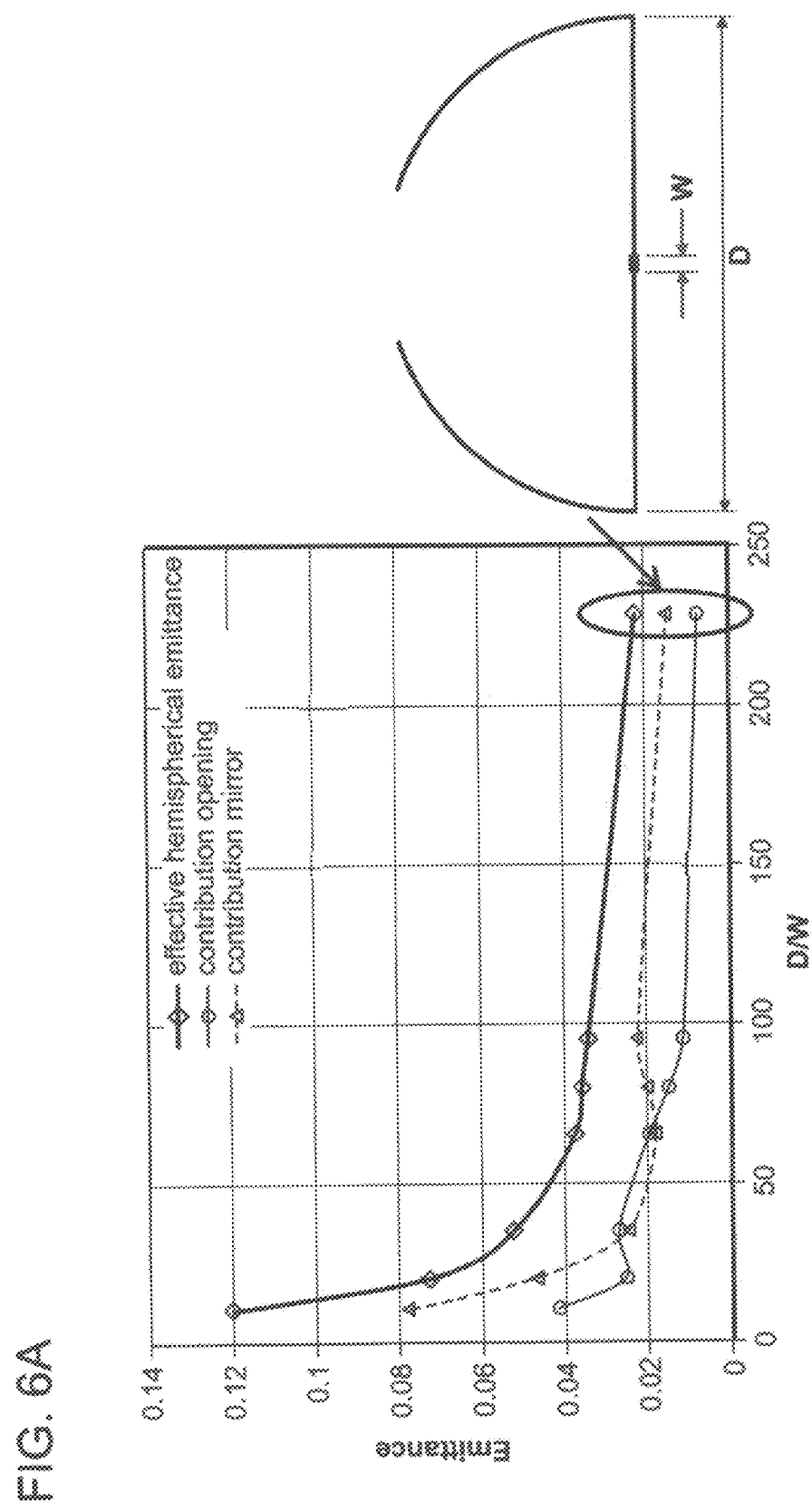
FIGS. 6a and b show simulation results for a black body solar absorber inside a hemispherical IR-mirror cavity with an acceptance angle of 5 degrees corresponding to a maximum theoretical 3D optical concentration of 347.
Figure 6B:
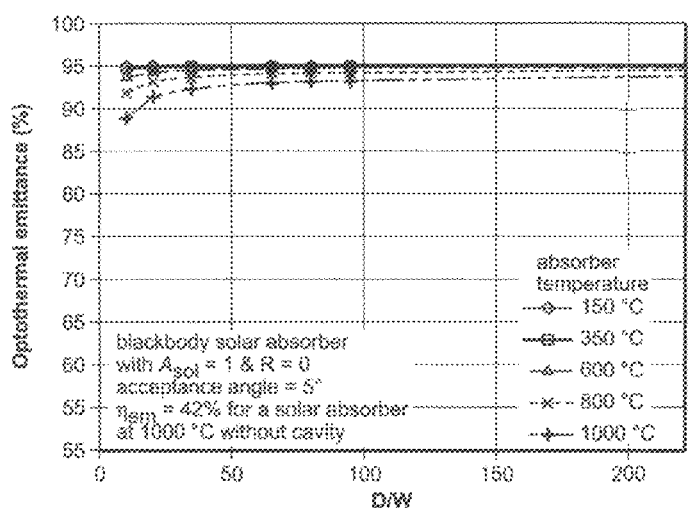

The 3D confinement of the IR emission achieved with a spherical cavity design dramatically reduces the effective hemispherical emittance of the solar absorber (FIG. 6a). For large ratio D/W the effective emittance reaches close to 2%. For a spherical cavity the heat loss through the opening is reduced, however, the IR absorption of the metal walls is more significant which is due to the increased metal surface area of a hemispherical compared to a half-cylindrical cavity. The low emittance and the 3D optical concentration required for the hemispherical cavity leads to optothermal efficiencies above 90% which is more than twice as efficient as a blackbody absorber (42% at 1000° C.) without a surrounding cavity (FIG. 6b). Additionally, the optothermal efficiency only shows a weak dependence on the absorber temperature up to 1000° C.

Figure 6B:
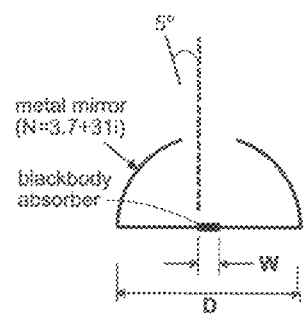
Figure 7A:
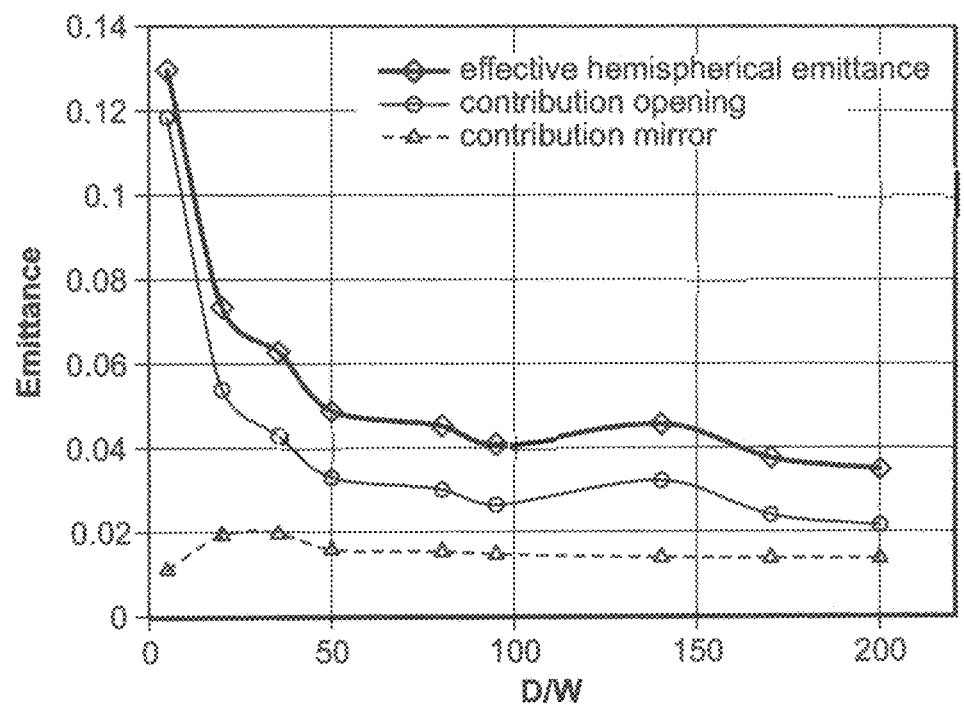
FIGS. 7a, b and c show simulation results for a wavelength-selective solar absorber inside a half-cylinder IR-mirror cavity with a metal mirror refractive index of n=3.7.
Figure 7A:
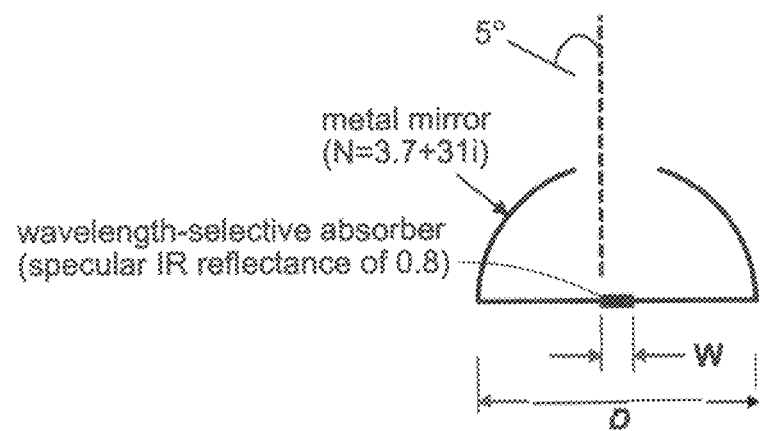
Figure 7B:
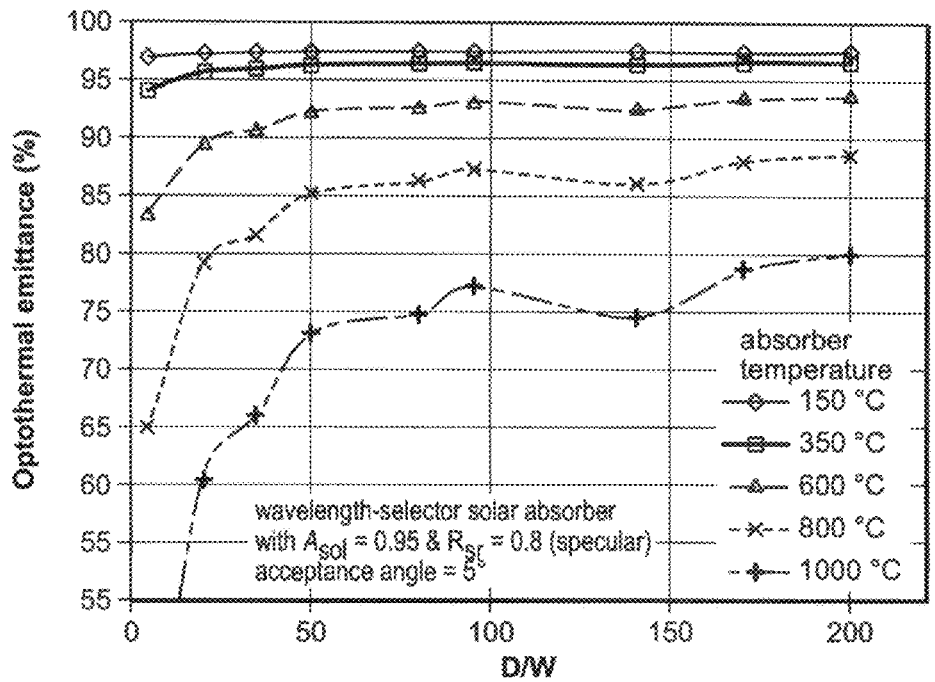
Figure 7C:
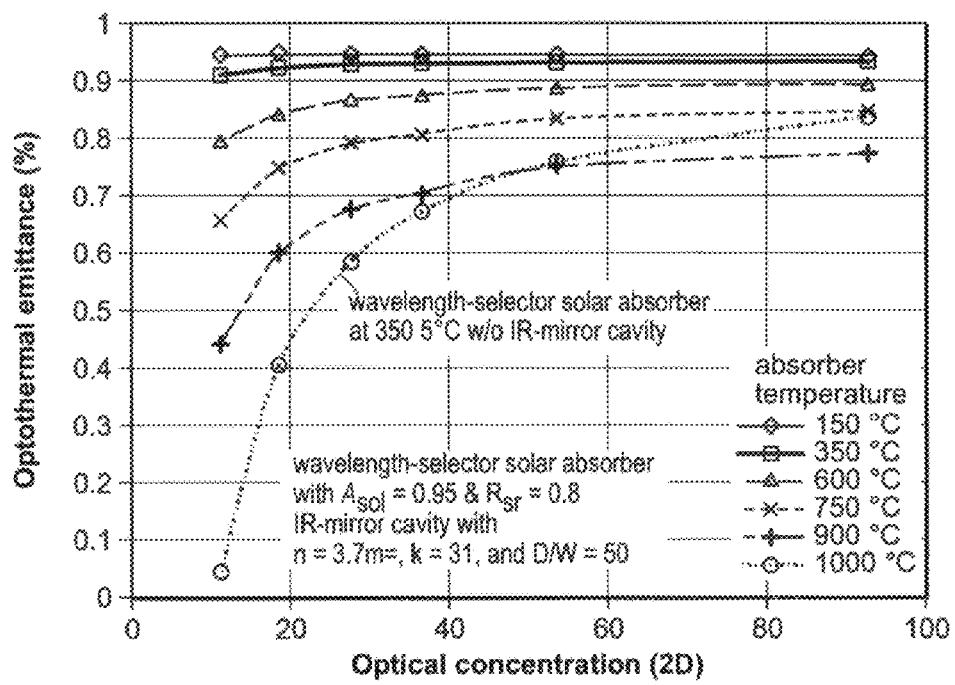

FIG. 6 shows simulation results for a blackbody solar absorber inside a hemispherical IR-mirror cavity with an acceptance angle of 5° corresponding to a maximum theoretical 3D optical concentration of 347. The cavity walls are assumed to be metal with constant refractive index N=3.7+31i resulting in finite IR absorption. The effective hemispherical emittances are obtained with a 3D Monte-Carlo Ray-Tracing method and the optothermal efficiency is calculated with the equation shown in FIG. 4. (a) The effective hemispherical emittance of the absorber decreases to close to 2% with increasing ratio D/W. The IR radiation lost through the cavity opening is drastically reduced compared to the cylindrical cavity. However, the IR radiation heat loss via the absorption at the cavity walls is more dominant due to the increased cavity surface area. (b) For the optothermal efficiency calculations a sunlight transmittance of 1, environmental temperature of 25° C., and a direct solar radiation flux of 800 W/m² is assumed. The optothermal efficiencies are neither strongly dependent on the ratio D/W nor on the absorber temperature up to a 100° C. and reach above 90%.

In order to improve the solar receiver cavity performance without the requirement of 3D optical concentration the use of a wavelength-selective solar absorber with a half-cylinder cavity is beneficial (FIG. 7). A typically wavelength-selective absorber is designed such that it exhibits a high solar absorptance but also a low IR emittance in the wavelength spectrum of the emitted radiation by the absorber at operating temperature. For the simulation results shown in FIG. 7 a solar absorptance of 0.95 and a gray hemispherical specular IR reflectance of 0.8 (equivalent to a gray IR emittance of 0.2) is assumed. The refractive index for IR-mirror wall is again N=3.7+31i. The effective hemispherical emittance of the solar absorber is significantly reduced (by a factor of about 2.5) compared to the same cavity design with a blackbody solar absorber. The emittance reaches about 5% at a ratio D/W of 50 and can go as low as 4% for very large ratios of D/W (FIG. 7a). In this design the major portion of the lost heat left through the cavity opening. The reduction of the emittance also manifests itself in the improvement of the optothermal efficiency of the solar receiver cavity (FIG. 7b). The effect of the ratio D/W is relatively weak even at moderate absorber temperatures for an acceptance angle of 5°. An optothermal efficiency of close to 80% at an absorber temperature of 600° C. should be achievable. As mentioned in section 3.1, the optothermal efficiency of the solar receiver cavity with perfect IR-mirror walls has a much weaker dependence on the optical concentration. This conclusion still holds even if the simulations account for the finite absorptance of the IR-mirror walls (FIG. 7c). The optothermal efficiency of the proposed solar receiver cavity is significantly improved especially at low optical concentrations compared to a solar absorber alone. For example, the optothermal efficiency improves by a factor of 2.25 from 40% to 90% at an optical concentration of 18.6 and for a ratio D/W of 50.

For a successful implementation of our proposed solar receiver cavity not only the performance but also the actual dimensions of the system is of great importance. In the previous sections the effect of the ration D/W (diameter of cavity/width of absorber) on the effective absorber emittance and the optothermal efficiency are discussed. It was shown that the best performance will always be achieved for large ratios of D/W. However, in the case of large D/W the width L of the lens is smaller than the diameter of the cavity. Consequently, a fraction of the sunlight is not focused into the cavity onto the solar absorber but hit the outside walls of the cavity and is lost. For that matter in FIGS. 6a and 6b the effective emittance of the solar absorber and the resulting optothermal efficiencies for various temperature together with the ratio D/L is plotted for a solar receiver cavity with an acceptance angle of 5°. The effective emittance drops steeply to about 5% for a ratio D/W of 50. The ratio D/L increases linearly to about 3. As already discussed in previous sections the optothermal efficiency shows a weaker dependence on D/W for moderate temperatures reaching about 80% at an absorber temperature of 600° C. for D/W of 15 and a corresponding D/L of about 1. It might not be necessary that the width of the lens is exactly the same as the diameter of the cavity because the proposed system requires at least 2D tracking. Consequently, in a large-scale solar farm the solar receiver cavities with the concentrator optics have to be placed with a certain distance to allow the tracking of the sun with shading effect. The third important geometrical ratio is the $F_{lens}/L$ (focal length/width of lens) which has the value 11.4 for the presented design. With the given ratios the absolute dimensions of the systems can be calculated. For example, for an absorber size of 1 cm and a 2D optical concentration of 18.6 (acceptance angle 5°) the width of the lens is 18.6 cm and the distance between the absorber and the lens is 212 cm. The diameter of the cavity can be calculated from the optimized ratio D/L.

Figure 8A:
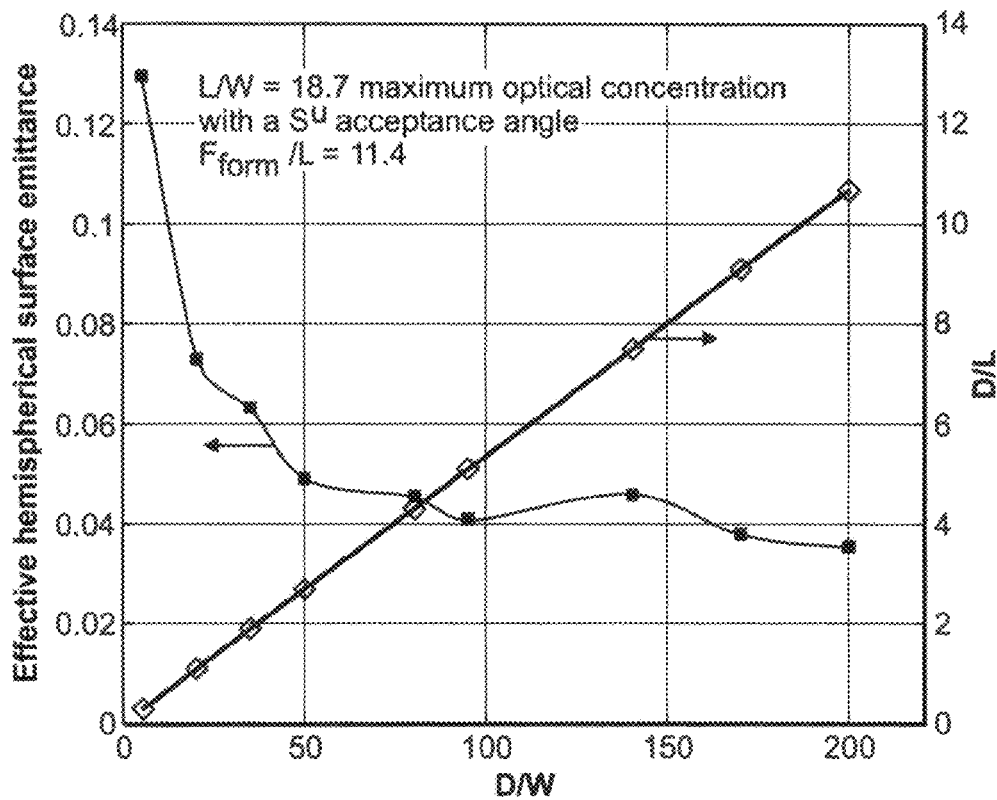
FIGS. 8a, b and c show simulation results of solar thermal performance as a function of system dimensions.
Figure 8B:
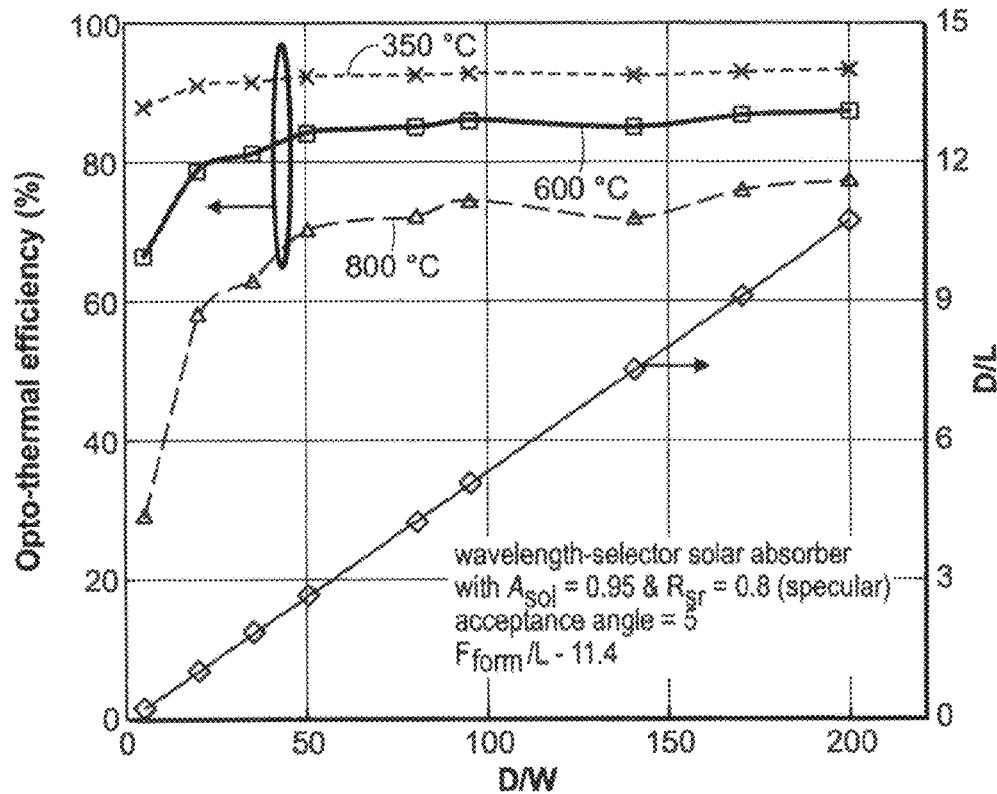
Figure 8C:
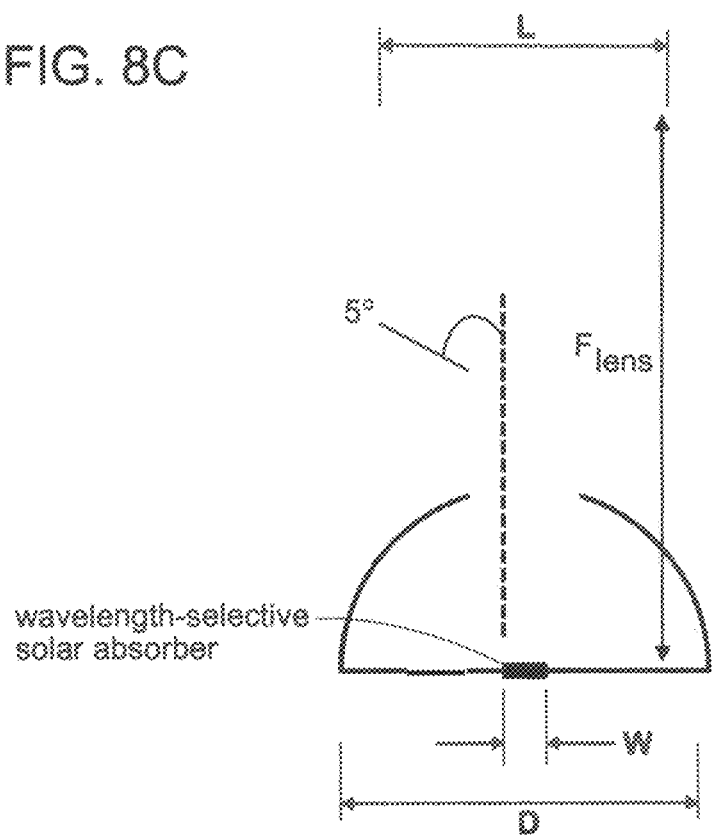

FIG. 8 shows the simulation results of the solar thermal performance as a function of the system dimensions are illustrated for a half-cylinder solar receiver cavity with metal surfaces (N=3.7+3.1i), an acceptance angle of 5° ($OC_{2D}$=18.6), and with a wavelength-selective solar absorber (A=0.95, $R_{IR}$=0.8). The system with the investigated system geometries is illustrated on the right. (a) The effective hemispherical emittance of the solar absorber decreases with increasing ratio D/W while the ratio D/L increases. (b) For an efficient solar receiver cavity a low effective IR emittance and thus, large D/W is advantageous. However, for high overall system efficiency the ratio D/L should be close to 1.

Other 2D cavity geometries are theoretically predicated to achieve higher performance than the cylindrical cavity with a circular cross-section described above. With the circularly cylindrical cavity, some IR radiation from the absorber that hits the reflective cavity walls is not directly reflected back to the absorber. This degrades performance, as multiple reflections in the reflective cavity provide more opportunities for the radiation to escape through the aperture or be absorbed by the reflective cavity walls. The geometry thus needs to be altered such that all radiation from the absorber that strikes the reflective walls will return to the absorber in a single reflection.

Figure 9A:
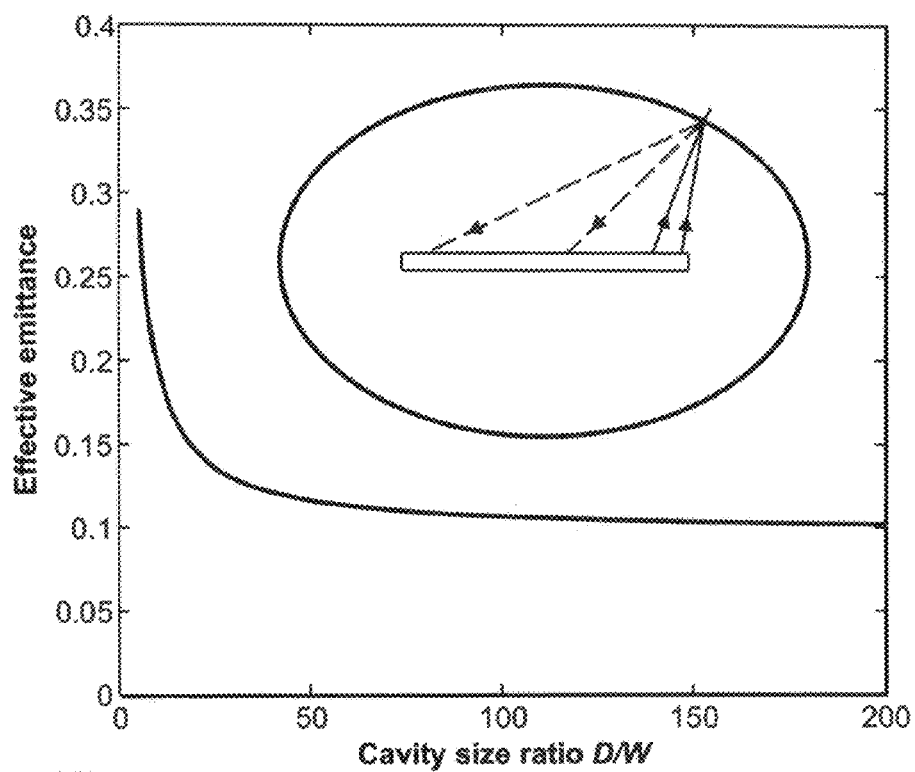
FIGS. 9a and b are graphs showing absorption and emission characteristics of a black body absorber enclosed in a 2D elliptical cavity.

In particular, an elliptical reflector has the property of reflecting all rays from one of its foci to the other focus. Thus, a cylindrical cavity with an elliptical rather than a circular cross-section and the absorber spanning the foci of the ellipse offers improved angularly-selective properties. This is illustrated in the inset to FIG. 9(a), which shows that any ray from the edge of the absorber will be reflected to the opposite edge. Any ray from the middle of the absorber will thus form a shallower reflecting angle (closer to the surface normal) and still be reflected back to the absorber. Accordingly, the elliptical cavity has ideal reflecting behavior, as all radiation from the absorber is returned back to it in a single reflection.

Owing to the ideal reflective properties of the elliptical cavity, absorption and emission characteristics of a enclosed blackbody absorber can be predicted using a simple analytical expression (Eq. 3) and ray tracing methods are not needed. The effective emittance $\epsilon^*$ of the blackbody absorber is given simply by $$\epsilon^* = F_{abs,ap} + F_{abs,cav}(1-R_{cav}), \quad (3)$$

where $F_{abs,ap}$ is the view factor from the absorber to the aperture, $F_{abs,cav}$ is the view factor from the absorber to the reflective cavity walls, and $R_{cav}$ is the secular reflectance of the cavity walls.

Figure 9B:
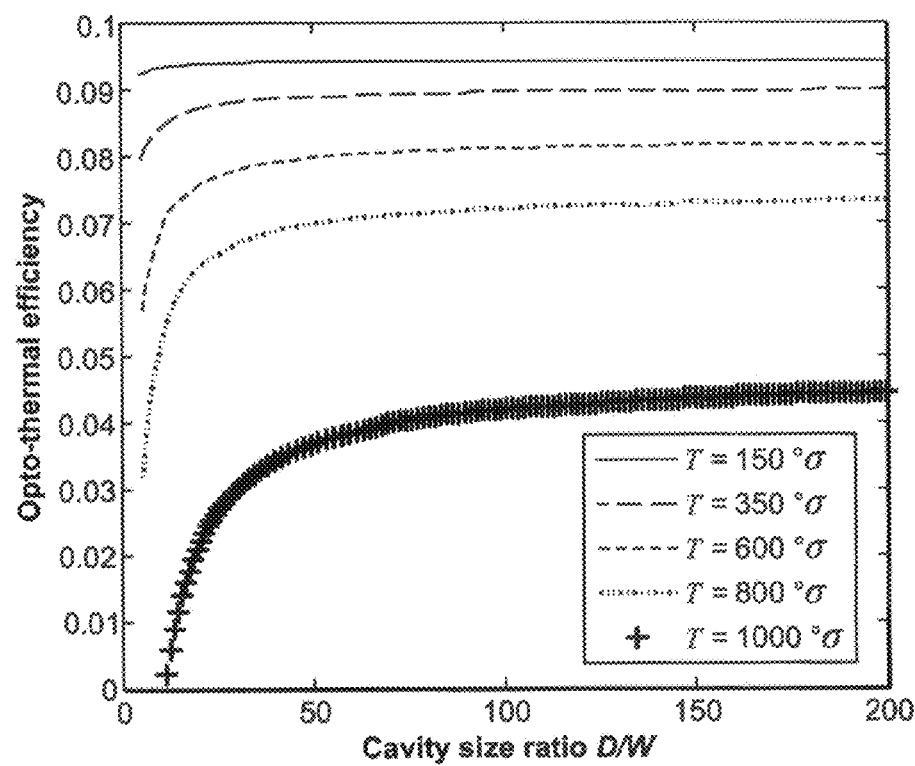

FIG. 9(a,b) shows the effective emittance and the corresponding opto-thermal efficiency for a blackbody absorber enclosed in a 2D elliptical cavity. The parameters used in the simulations are as follows: an acceptance angle of 5°, a 2D optical concentration of 18.6, and a cavity wall reflectance of 0.99. For high D/W ratios (those greater than 50) there is little difference in performance between the elliptical cavities and the circular cylindrical cavities explored earlier. This is because for such a high D/W ratios, the foci of the ellipse are very close to each other, and the ellipse is almost a circle. For lower D/W ratios, the benefit of the elliptical cavity is more apparent.

Although the ideal elliptical reflective cavity offers the performance improvement over the circular cylindrical one, fabrication-induced deviations from the ideal elliptical geometry may weaken the ideal reflectance conditions. Accordingly, both geometries need to be evaluated experimentally to find the optimum cavity design.

Similarly to the 2D case presented above, the performance of an absorber enclosed in a 3D spherical cavity can also be improved by modifying the cavity geometry. The improved cavity geometry is an oblate ellipsoid, and the optimized radius of the absorber is $r=\sqrt{a^2-c^2}$, where $a$ is the semimajor axis and c is the semi-minor axis. This radius is analogous to the distance between the center and a focus of the ellipse in the 2D case. With the geometry set this way, the same ideal reflecting behavior occurs: all radiation from the absorber which strikes the reflective cavity walls will return to the absorber in a single reflection. This means that effective emittance of a blackbody absorber in a 3D ellipsoidal cavity can also be found using Eq. 3 above.

Figure 10A:
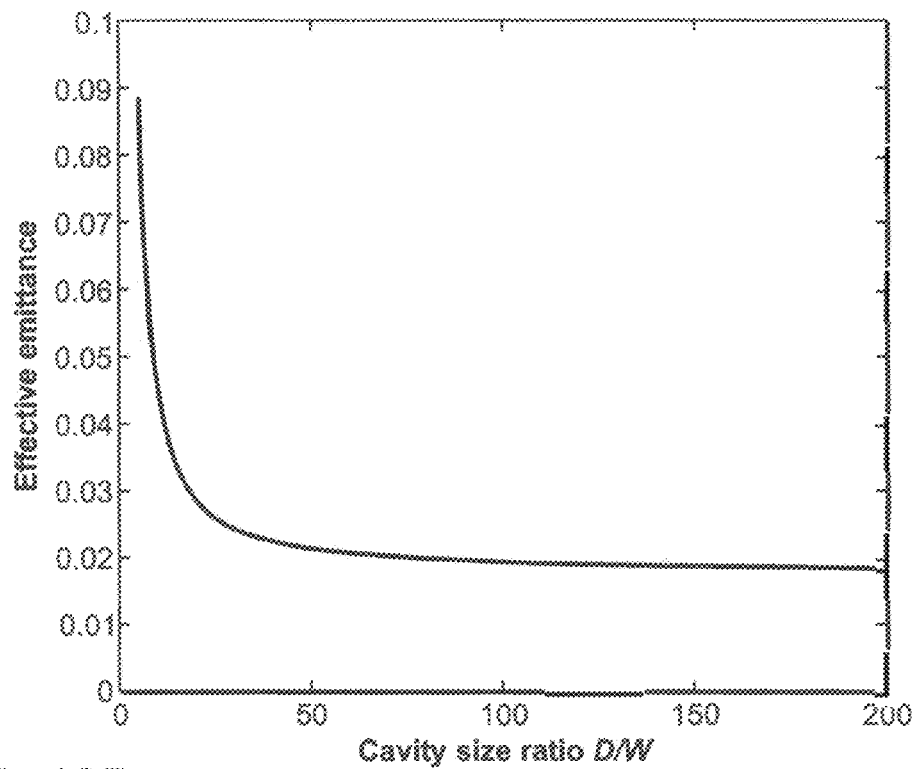
FIGS. 10a and b are graphs showing absorption and emission characteristics of a black body absorber enclosed in a 3D ellipsoidal cavity.
Figure 10B:
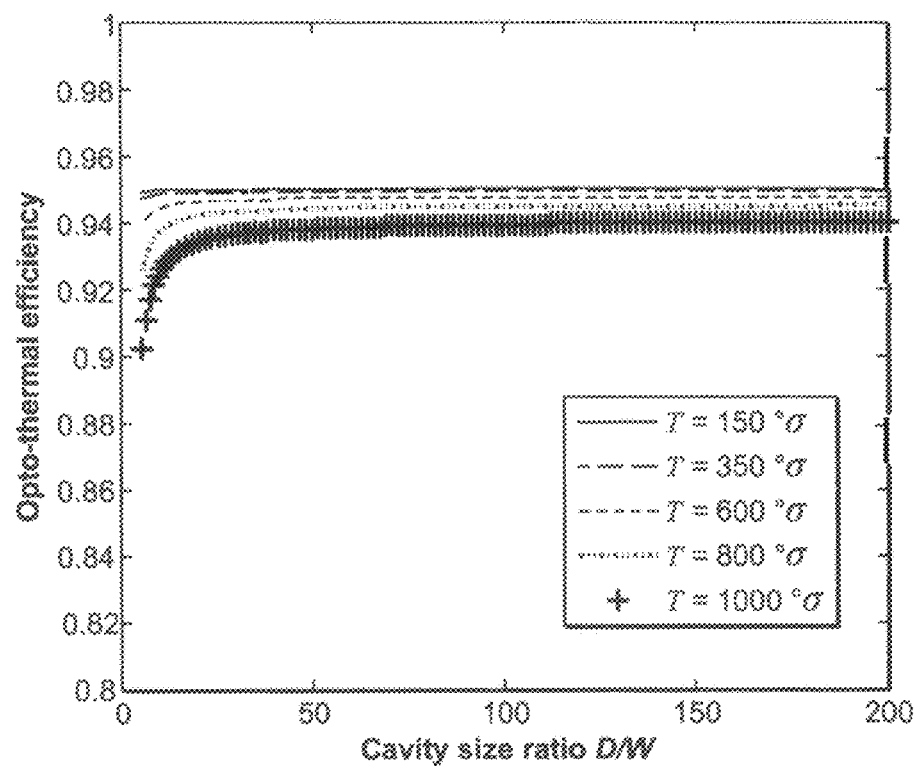

FIG. 10 shows results for a blackbody absorber in a 3D ellipsoidal cavity. The parameters used are an acceptance angle of 5°, a 3D optical concentration of 347 and a cavity wall reflectance of 0.99. Similar to the 2D elliptical case, differences in performance are not significant at high D/W ratios, as for these geometries the ellipsoid is almost spherical. Improvements in the performance are more noticeable for small D/W ratios, and it is in this regime where pursuing the ellipsoidal cavity might be worthwhile despite the potentially higher manufacturing costs.

Figure 11A:
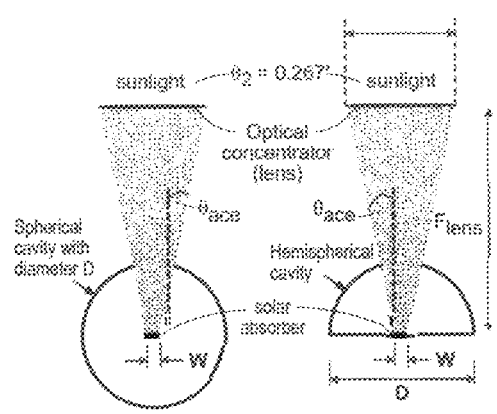
FIGS. 11a, b and c are schematic illustrations of suitable designs of a solar receiver cavity with an optical concentrator.
Figure 11B:
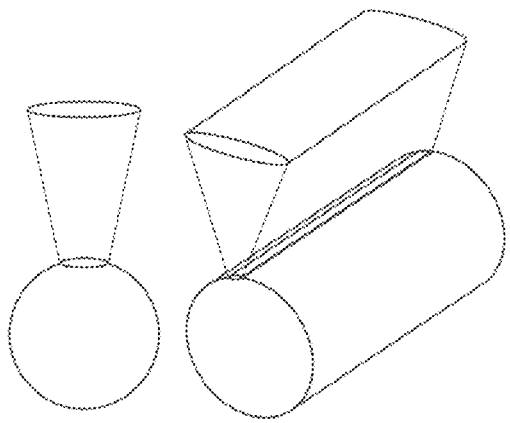

As previously mentioned possible system designs can be a spherical (3D)/cylindrical (2D) or a hemispherical (3D)/half-cylinder (2D) solar receiver cavity combined with a lens as the optical concentrator aligned and mounted in front of the cavity opening (FIGS. 11a and 11b). (c) For a cavity design with the cavity diameter much larger than the absorber width it might be advantageous to approximate the spherical/cylindrical geometry with an IR "Fresnel" mirror on the walls. This enables the area of the lens to be equal to the projected area of the solar receiver cavity (D/L=1). In the case of a system with large optical concentration (large L/W) a concave focusing mirror can potentially be used instead of a lens.

Figure 11C:
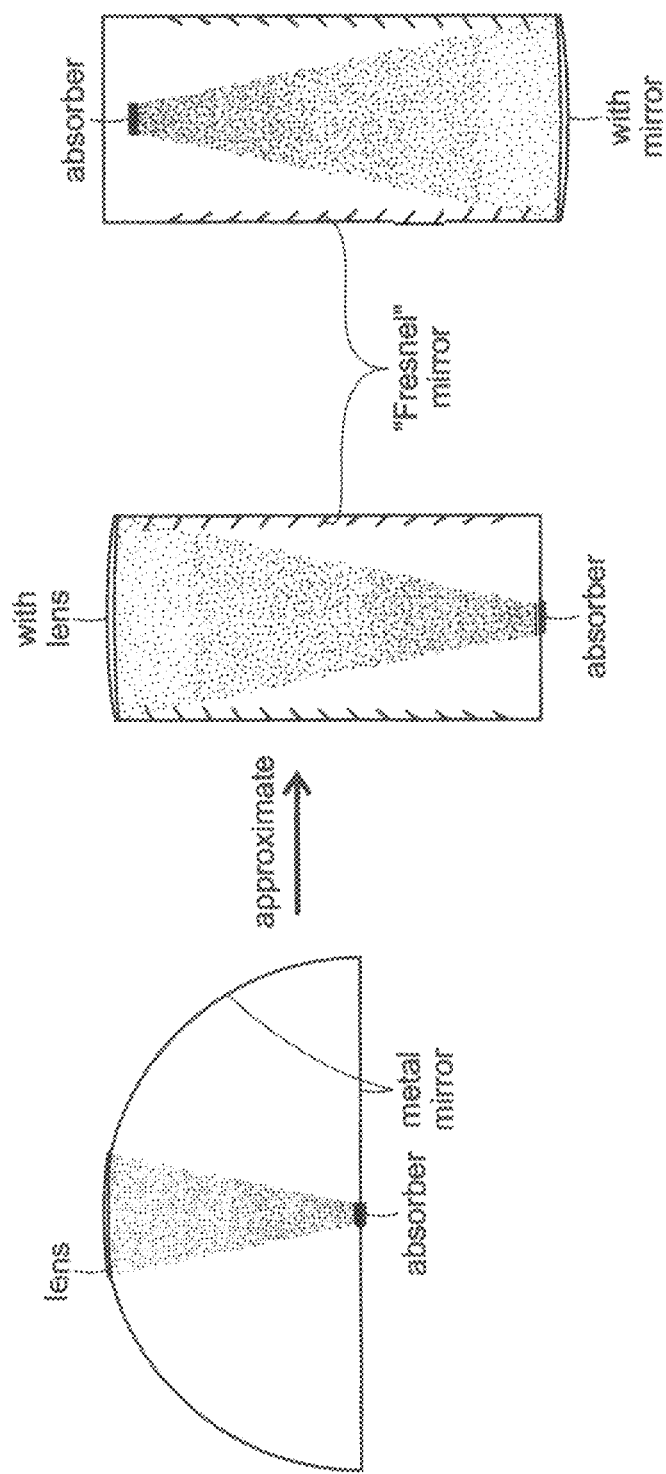

FIG. 11 shows possible designs of a solar receiver cavity with an optical concentrator. 2D (a) and 3D (b) schematics of a spherical/cylindrical and hemispherical/half-cylinder cavity with a lens mounted in front of the cavity of similar size and aligned with the cavity opening. (c) In the case of large ratios of D/W when the lens is mounted at the opening of the solar receiver cavity the hemispherical (3D)/half-cylinder (2D) cavity can be replaced with an IR "Fresnel" mirror on a cylinder (3D)/rectangle duct (2D) walls approximating the hemispherical/half-cylinder geometric. This will allow a very large ratio of D/W while maintaining a D/L of 1. For relatively large optical concentration (small fraction of the mirror is shaded by the absorber) a mirror could be used instead of a lens as the concentrator.

Figure 13A:
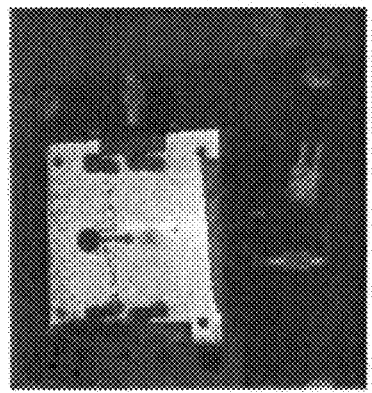
FIGS. 13a, b, c and d are photographs of an experimental set up.
Figure 13B:
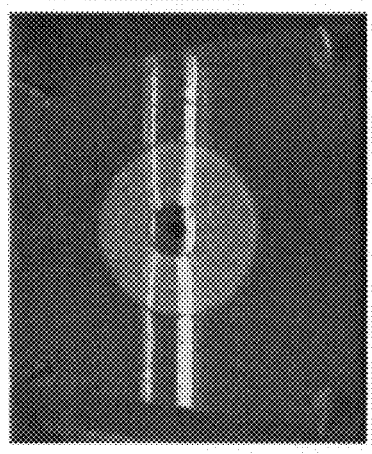
Figure 13C:
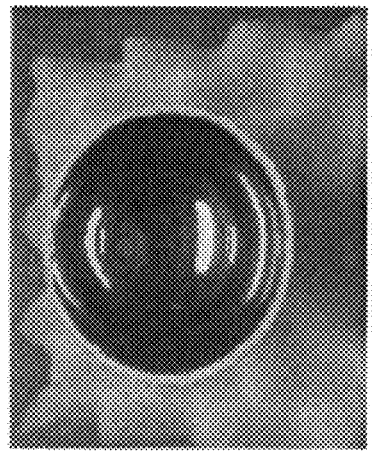
Figure 13D:
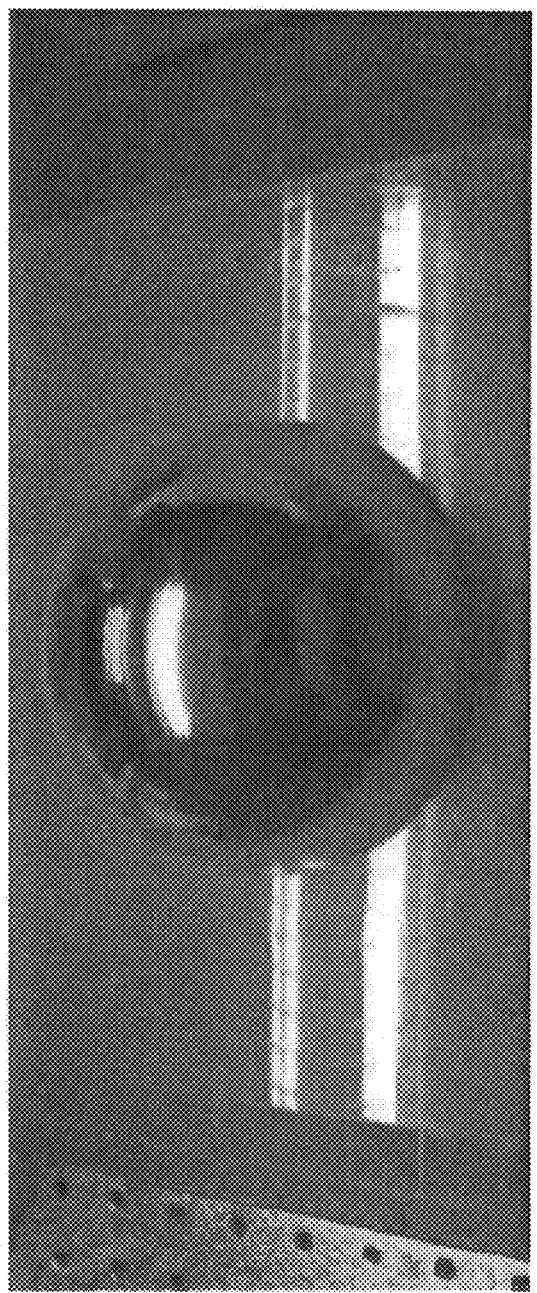

Experimental measurements are being performed to validate theoretical estimates of the effective emittance reduction by the reflective optical cavity, which leads to the improvement of the optothermal efficiency of solar-thermal systems. The experimental setup shown schematically in FIG. 12 was used to measure the effective emittance of an absorber surface with and without the cavity. First, the absorber surface is brought to an elevated temperature $T_H$ in the absence of the reflective cavity, and the power $P_1$ required to maintain this temperature is measured. The process is then repeated with the absorber covered by the reflective optical cavity, and a lower power $P_2$ needed to maintain the same temperature is measured. Since we expect that all losses from the heater and absorber surfaces besides the radiative losses from the top $Q_{loss}$ should be the same, we can calculate the reduction in the effective emittance $\Delta \epsilon$ by $$\Delta \epsilon = \frac{P_1 - P_2}{A_{abs}\alpha(T_H^4 - T_{amb}^4)}, \quad (4)$$

where $A_{abs}$ is the absorber area, $\alpha$ is the Stefan-Boltzmann constant and $T_{amb}$ is the ambient temperature.

an experimental rig was constructed in order to test the reduction in the effective emittance for a hemispherical cavity (FIGS. 13a, b, c and d). A 1 cm diameter copper heater block with its top surface painted black was used as the absorber surface with the emittance close to that of a blackbody. The heater was coupled to a two-axis linear stage for alignment. The floor of the cavity was composed of plastic sheets with holes to precisely couple the absorber surface and the hemispherical dome. While the plastic is not reflective, if the cavity operates as theoretically predicated (i.e., through specular reflection), then the dome surface properties play the major role in modifying the effective emittance of the absorber. Specifically, if the effective emittance is reduced despite a non-reflective floor, it is a good indication that the cavity is not acting as a diffuse radiation shield. The optical cavity used was a 10 cm diameter hemispherical dome with a gold coating of greater than 200 μm thickness. While gold is not the most reflective metal in the visible spectrum, it is highly reflective in the IR spectrum, which is relevant for a blackbody absorber at the temperatures used in solar-thermal systems.

Preliminary results from this experiment are promising, although more work is needed to achieve experimental emittance reductions that match the theoretical predictions. Table I shows power inputs required to maintain temperatures of 100° C., 200° C. and 300° C. with and without the optical cavity.

TABLE 1

Power inputs required to maintain constant absorber surface temperature: +/- values for 3 standard deviation uncertainity

| Temperature | Power input without cavity | Power input with cavity |
| --- | --- | --- |
| 100° C. | 0.114 +/- 0.005 W | 0.081 +/- 0.007 W |
| 200° C. | 0.376 +/- 0.007 W | 0.253 +/- 0.010 W |
| 300° C. | 0.864 +/- 0.011 W | 0.567 +/- 0.022 W |

Figure 14:
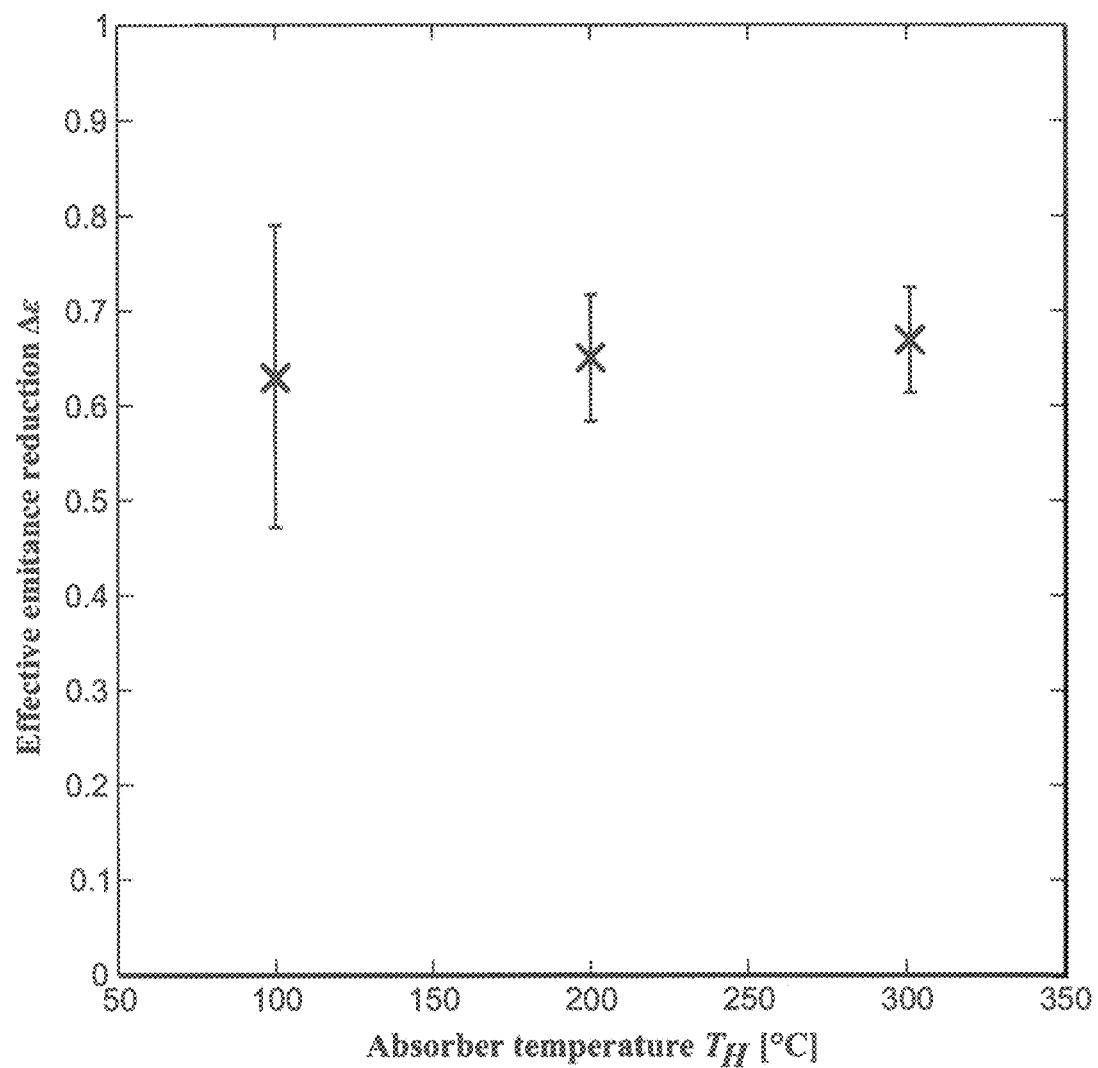
FIG. 14 is a graph of effective emittance reduction against absorber temperature.

Using Eq. 4, these power inputs can be related to the effective emittance reductions, which are shown in FIG. 14. The measured effective emittance reduction is in the range of 0.6 to 0.7. This result is important as it demonstrates a reduction significantly higher than that from a diffuse radiation shield. It falls short of the expected reduction of 0.8 to 0.9 for a cavity of this size ratio with no aperture. This indicates that there still exists room for improvement through better absorber/cavity alignment and more specularly reflective cavity surfaces. It should be noted that for a blackbody absorber we do not expect a change in effective emittance reduction with temperature; different temperatures are investigated because low temperatures have poor signal-to-noise ratios (translating into the large error bars at 100° C.). Extremely high temperatures have not been used for preliminary testing because they introduce unnecessary risk of damaging the heater block.

The theoretical simulations suggest that the proposed solar receiver cavity will exhibit significantly higher optothermal efficiencies especially at low optical concentration compared to conventional blackbody receiver cavities and solar receivers based on the wavelength selectivity of a solar absorber. This has the big advantage that the required optical concentration will be relatively low even for high temperature applications such as conventional concentrating solar power based on thermal mechanical engines, concentrating solar thermoelectrics, solar thermophotovoltaics, and solar thermionics. Thus, the size, weight, and cost for the corresponding optics will likely be smaller. Solar receivers can achieve reasonable optothermal efficiencies at moderate optical concentration due wavelength-selective solar absorbers. However, solar receivers typically show a quite strong dependence on the solar absorber temperature due to the increasing overlap of the solar spectrum and absorber emission spectrum and possible changes of optical material properties with increasing temperature. The proposed solar receiver cavity with a blackbody solar absorber solely exhibits a directional selectivity which will result in a temperature-independent effective hemispherical emittance due to the wavelength-independent indices of refraction for metals resulting in a constant spectral IR reflectance of the cavity wall. Substituting the blackbody with a spectrally-selective solar absorber will further reduce the effective emittance. However, it will also introduce some, yet less pronounced, temperature dependence on the optothermal efficiency.

We also propose a solar thermal upconversion scheme that utilizes the angular selectivity of the reflective cavity discussed above to achieve high overall solar-to-electricity conversion efficiency, higher than the common Schokley-Queisser (S-Q) limit [5, 6]. The S-Q limit stems from three major intrinsic limitations to the photovoltaic (PV) conversion efficiency imposed by the fundamental laws of thermodynamics and quantum mechanics. They include: (i) the losses due to thermalization of charge carriers generated by absorption of the photons with the energies above the bandgap of the PV material, (ii) the losses caused by the PV cell inability to use the photons with the energies below the bandgap, and (iii) the losses caused by recombination of the light-generated charge carriers. Technical—or extrinsic—limits, such as e.g., low absorption efficiency of the material, can overcome by the proper design of the photovoltaic cell. The explored design approaches to improve extrinsic limits include using anti-reflecting coatings and back mirrors, texturing the cell surface with periodic or nature-inspired non-periodic nano-patterns, coupling of the incoming radiation into propagating or localized modes within the cell, etc [9-16]. However, even the 'ideal' solar cells—those that absorb 100% of incident photons and enable collection of all the generated charge carriers not lost in the recombination processes—have a maximum intrinsic limiting efficiency of 31% (for the illumination by non-concentrated sunlight) [5, 6].

Several approaches to exceed the Shockley-Queisser efficiency limit have been proposed. These include engineering multiple-junction [4, 6] and intermediate-band [17, 18] solar cells, which—in the ideal infinite-junction case—can eliminate the thermalization losses, and using concentrated sunlight [1, 6], which helps to counteract the recombinative radiation losses. Mechanisms of either electronic [19-21] or thermal [22] down-conversion of high-energy photons into two or more lower-energy photons have also been shown to increase the intrinsic thermodynamic efficiency limit. Alternative approaches have also been explored, including electronic up-conversion of the low-energy photons [23], thermo-photovoltaics, and thermophotonics [24, 25]. The theoretically predicted thermodynamic efficiency limits for the solar cell structures of varying design complexity based on the mechanisms described above are summarized in Table II together with the proposed mechanism of thermal downconversion.

TABLE II

Limiting thermodynamic efficiencies of photovoltaic platforms of varying complexity and sunlight concentration: *AM1.5 terrestrial solar irradiance, #6000K blackbody radiation

| Platform | Limiting efficiency | Complexity | Concentration |
| --- | --- | --- | --- |
| Single-junction PV cell [6]*[4, 26]# | *31%-*37%-#40.8% | 1 bandgap | 1-1000-max |
| Tandem PV cell [4, 26]# | 42.9%-55.7% | 2 bandgaps | 1-max |
| Multiple-junction PV cell [6]* | 72% | 36 bandgaps | 1000 |
| Infinite-junction PV cell [4, 26]# | 69.9%-86.8% | ∞ bandgaps | 1-max |
| Intermediate-band PV cell [18]* | 49.4%-56.8%-60.9% | 1 bandgap + 1 impurity level | 1-100-1000 |
| PV + electronic upconversion [23]# | 47.6%-63.2% | 1 bandgap + 1 upconverter | 1-max |
| PV + electronic downconversion [21]# | 39.6% | 1 bandgap + 1 downconverter | 1 |
| Thermo-photovoltaics [25]# | 85% | 1 bandgap + 1 thermal emitter + 1 filter | max |
| PV + thermal upconversion# | 76% | 1 bandgap + 1 upconverter | 1 (angular restricted) |

As Table II demonstrates, the highest resulting limiting efficiency can theoretically reach 86.8%, however, this scheme would require a PV cell with an infinite number of p-n junctions and the maximum-concentration illumination by the sunlight. The maximum efficiency of the thermo-photovoltaic scheme theoretically reaches 85%. The general idea is based on concentrating sunlight onto the intermediate thermal absorber, which is enclosed by a PV cell and a frequency-selective filter that transmits only the photons with the energy equal to the bandgap of the PV cell. Reaching the 85% maximum efficiency limit, however, requires unrealistic conditions such as absorber operating temperature of 2478K, an ideal narrow-band transmission filter, and a large ratio of the absorbing-to-emitting surface areas.

Below we describe a practical thermo-photovoltaic scheme to exceed the Shockley-Queisser limit, in which the photons with the energies below the bandgap of the PV cell are first absorbed by the hot surface, and subsequently re-emitted with higher energies towards a photovoltaic cell.

Figure 15:
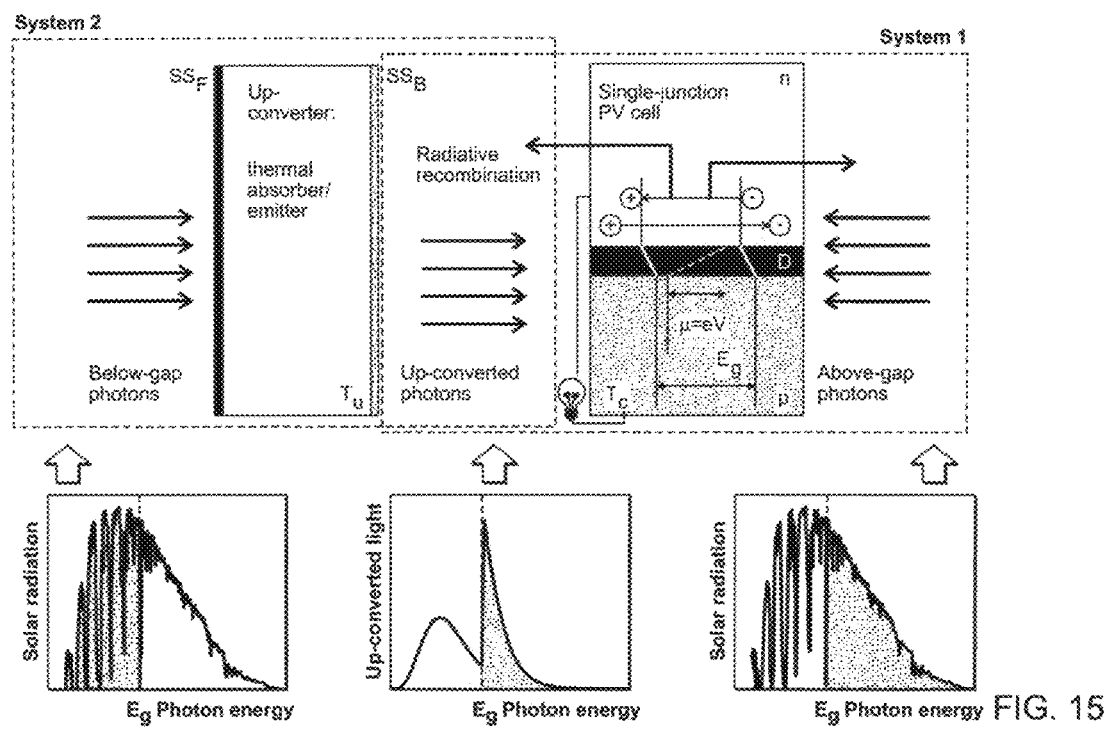
FIG. 15 comprises schematic illustrations for the concept of thermal up conversion.

The proposed hybrid thermo-photovoltaic energy conversion platform consists of at least one single-junction solar cell and a solar-thermal upconverter—a slab of absorbing material with spectrally- and angularly-selective surfaces at both, sun-illuminated and shadow sides, as shown in FIG. 15.

FIG. 15 is a schematic of the concept of the thermal upconversion. System 1 is a PV cell that receives sunlight photons with the energies above the bandgap through one surface, and the above-bandgap photons emitted by the upconverter through the other surface. System 2 comprises a solar absorber with surfaces having optimized spectrally- and angularly-selective emittance properties.

Figure 16A:
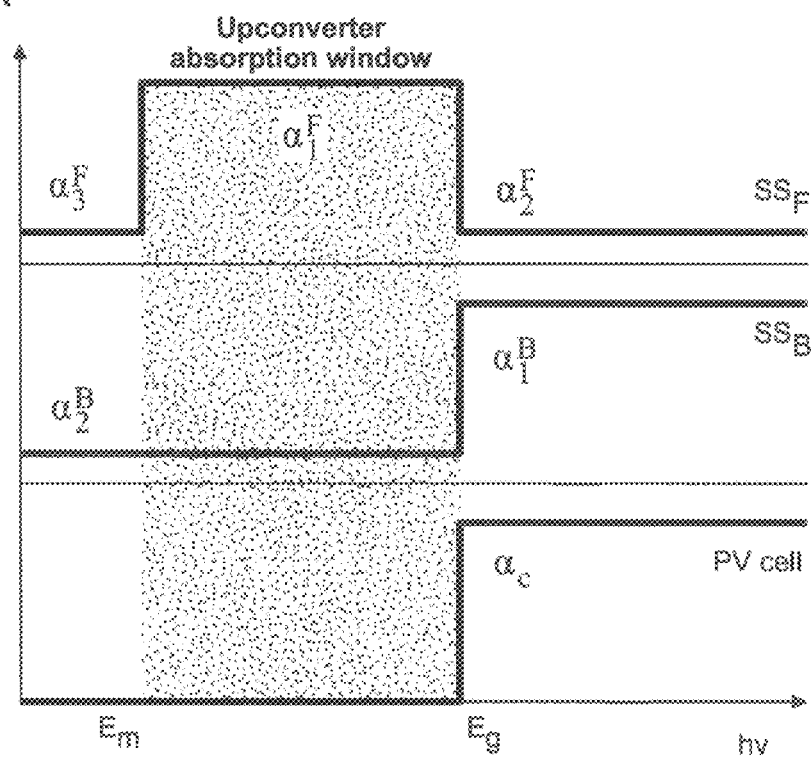
FIGS. 16a and b show step-wise absorption/emission characteristics of the spectrally selective surfaces of an up converter slab and PV cell.
Figure 16B:
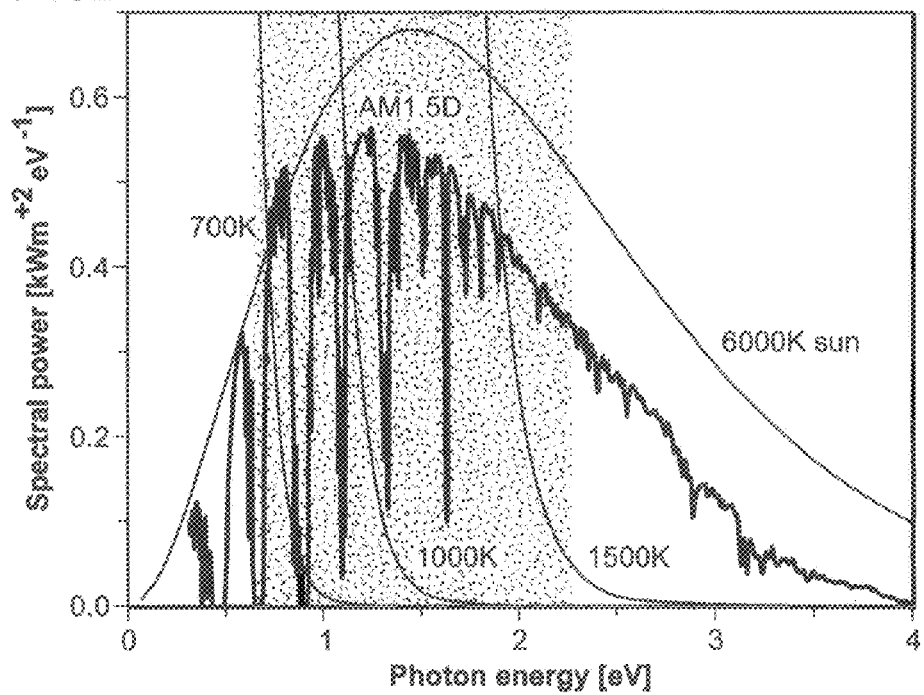

The sun-illuminated surface of the upconverter in FIG. 15 is highly absorptive to solar radiation but has a low angularly-restricted emittance at its operational temperature. Angular selectivity of the front surface can be achieved, e.g., by enclosing the upconverter into the reflective cavity with a limited angular aperture as described in the above sections. Ideally, the front surface is perfectly absorbing photons within the angular range of the incoming solar radiation, and perfectly blocks emittance at larger angles. The other surface of the upconverter that faces the PV cell is characterized by a high(low) emittance for photons with the energies above (below) the bandgap of the PV cell in System 1. The ideal frequency-dependent surface absorptance/emittance characteristics of the upconverter and the PV cell are shown in FIG. 16a and are overlapped with the solar spectrum shown in FIG. 16b. Note that a portion of the photons emitted by the PV cell towards the upconverter due to radiative recombination of the electron-hole pairs is absorbed and re-emitted back to the cell.

FIG. 16 (a) shows step-wise absorption/emission characteristics of the spectrally-selective surfaces of the upconverter slab and the PV cell in FIG. 10. The illuminated front (F) surface of the upconverter has high absorptance in the frequency range of incoming below-bandgap solar radiation and low emittance outside this range. The back (B) surface of the upconverter has high emittance in the above-bandgap wavelength range, and suppressed emittance elsewhere. The PV cell acts as a perfect blackbody for the above-bandgap frequencies and has low absorptance/emittance at below-bandgap frequencies. FIG. 16 (b) shows the AM1.5D solar spectrum and the thermal radiation spectra at high temperatures. The approximation of the solar spectrum as the 6000K angularly-restricted blackbody spectrum is included for reference.

This intrinsic thermodynamic efficiency limit of an ideal PV cell is a function of the PV cell material bandgap energy, and can be determined via detailed balance calculations, as first done by Shockley and Queisser [5]. These calculations are based on solving the photon current balance equations of photon absorption in the PV cell, generation of the electron-hole pairs, and their radiative recombination [5, 6, 25]. The conventional assumptions are the absolute absorptance of the cell $\alpha(E>E_g)=1$, infinite mobility of charge carriers—so that the electrons and holes quasi-Fermi levels are flat and separated by the energy gap $\mu=(E_{FC}-E_{FV})=e\cdot V$ (see FIG. 17)—and radiative recombination being the only recombination mechanism.

Figure 17:
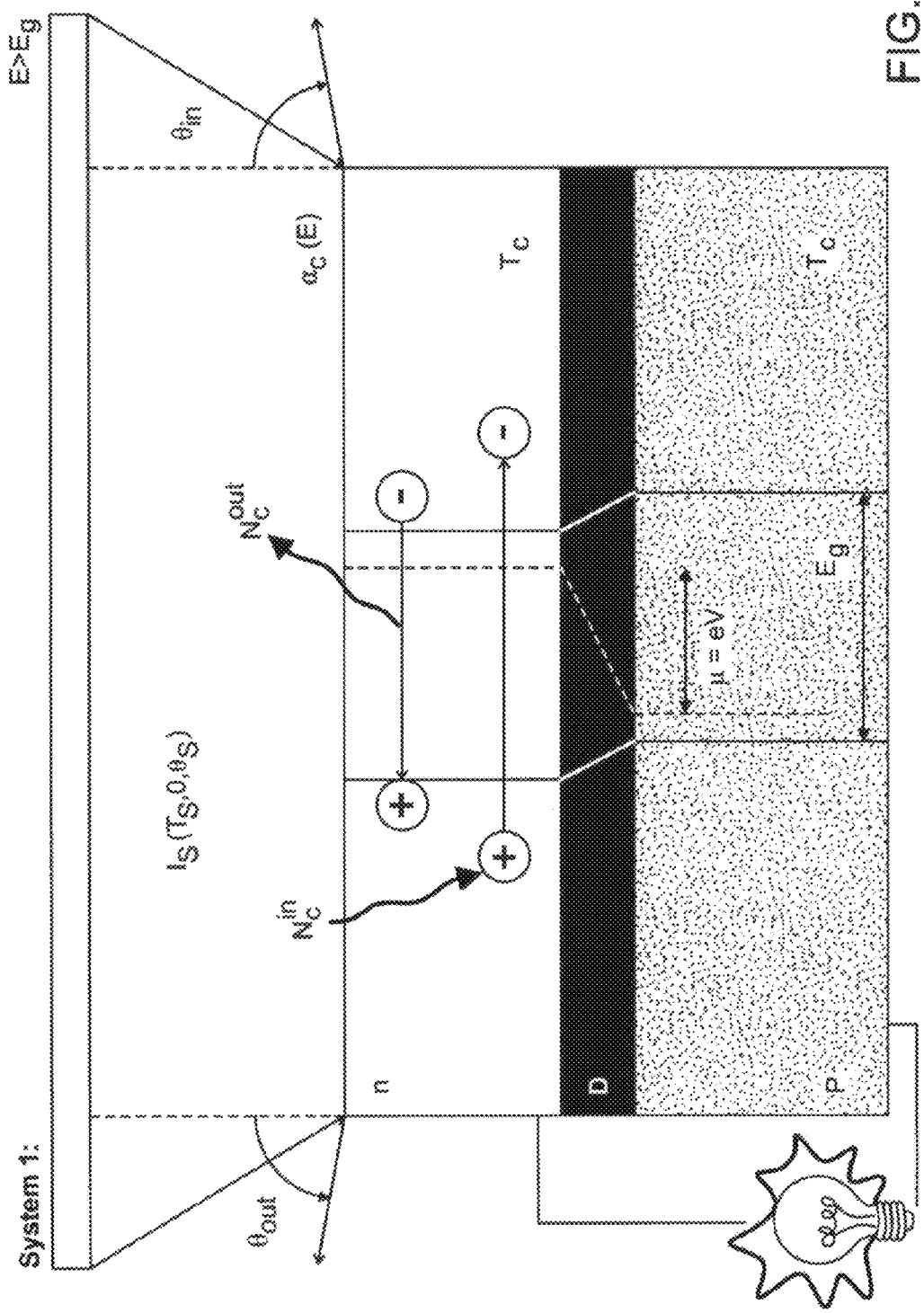
FIG. 17 is a schematic illustration of the detailed-balance Shockley-Queisser model for a single-junction PV cell.

FIG. 17 is a schematic of the detailed-balance Shockley-Queisser model for a single-junction PV cell. The incoming photon flux $N_c^{in}$ generates electron-hole pairs, a portion of which is collected at the contacts to generate the electric current, while the rest radiatively recombine and generate outgoing photon flux $N_c^{out}$.

The charge current is given by the difference in the generation and recombination rates of the electron-hole pairs in the PV cell material.

$$J = e \cdot (N_c^{in} - N_c^{out}(eV)), \tag{5}$$

where the incoming/outgoing photon fluxes are the above-the-bandgap solar photon flux and the photon flux due to the radiative recombination in the PV cell, respectively. The fluxes in (5) are a function of the sun ($T_s$) and the PV cell ($T_c$) temperatures, as well as the angular- and spectral absorptance/emittance characteristics of the cell surfaces $\alpha(E,\theta)$ [25]:

$$N(E_A, E_B, T, \mu, \theta_m) = \int_{E_A}^{E_B} dN(E, T, \mu) \int_0^{2\pi} d\varphi \int_0^{\theta} \alpha(E, \theta) \sin\theta \cos\theta \, d\theta. \tag{6}$$

For an angularly-selective surface the absorbed/emitted photon flux takes the following form:

$$N(E_A, E_B, T, \mu, \theta_m) = \pi \sin^2\theta_m \int_{E_A}^{E_B} \alpha(E) \, dN(E, T, \mu), \tag{7}$$

where photon distribution function obeys the Bose-Einstein statistics $$dN(E, T, \mu) = \frac{2\pi}{h^3 c^2} \frac{E^2 dE}{\exp((E-\mu)/k_B T) - 1}. \tag{8}$$

For the blackbody (thermal) emission, the chemical potential of radiated light is zero ($\mu=0$), while for the luminescent emission from the PV cell $\mu=(E_{FC}-E_{FV})=e\cdot V$.

The detailed balance efficiency of the PV cell is defined as the ratio of the maximum electrical power delivered to the load to the total power ($I_{sol}$) of the sunlight incident on the cell (which includes photons with the energies both above and below the bandgap):

$$\eta = \max(J \cdot V)/I_{sol}, \tag{9}$$

where maximum power point ($J_m$, $V_m$) can be found from the solution of the following equation:

$$d(J \cdot V)/dV = 0. \tag{10}$$

As already mentioned, the maximum achievable efficiency is limited by the energy losses due to thermalization of high-energy photons, the inability of the low-energy photons to generate electron-hole pairs, and by the losses due to radiative recombination. As a result, the maximum efficiency value is ~31% for the 6000K black body solar spectrum or ~33% for the AM1.5D terrestrial solar spectrum. To overcome these losses, we combine the PV cell with the thermal upconverter with the emittance properties described in FIGS. 15,16 (System 2).

Figure 18:
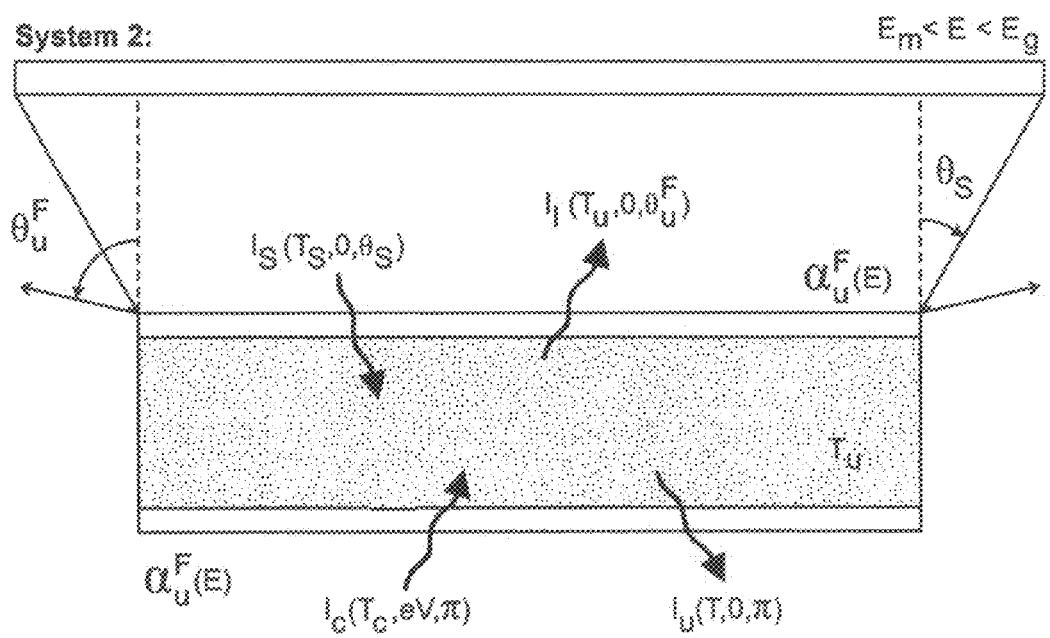
FIG. 18 is a schematic illustration of the energy-balance model for a thermal up converter with angularly- and spectrally-selective surfaces.
Figure 19A:
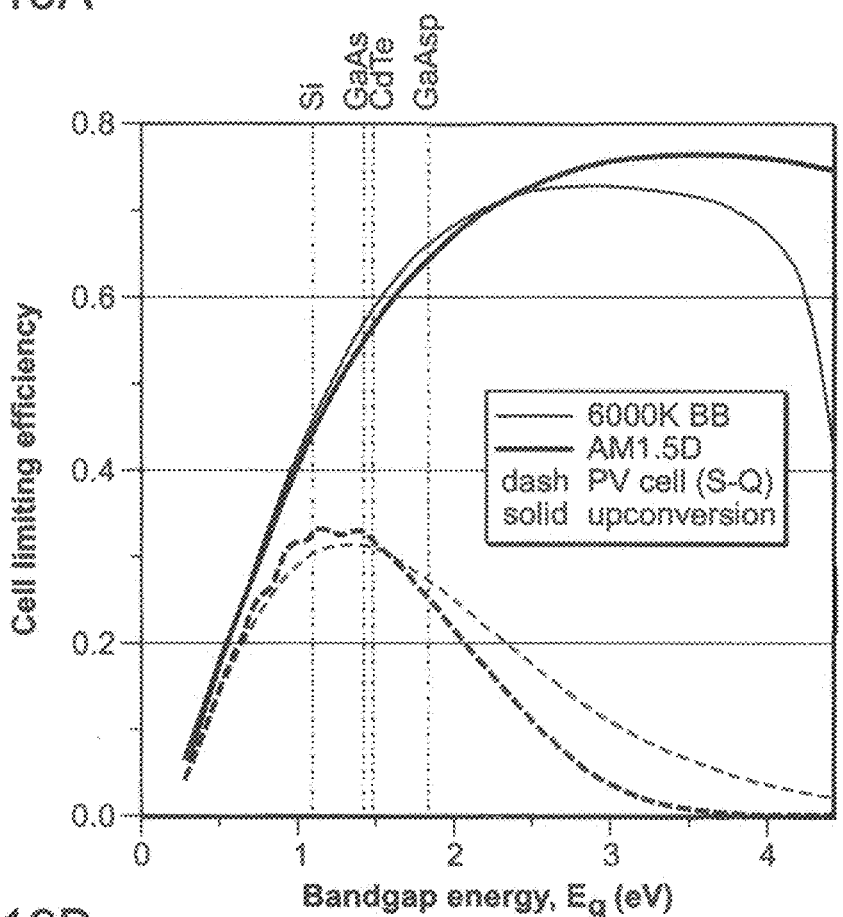
FIGS. 19 a, b, c and d are graphs of maximum efficiency and I-V characteristics of the hybrid energy converter as a function of the PV cell bandgap energy in an ideal case.
Figure 19B:
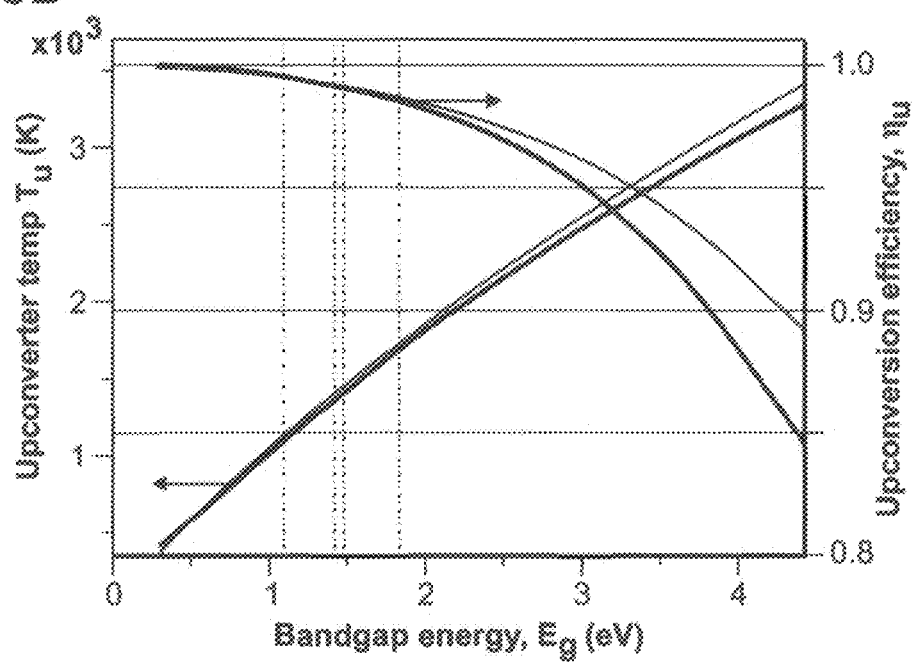
Figure 19C:
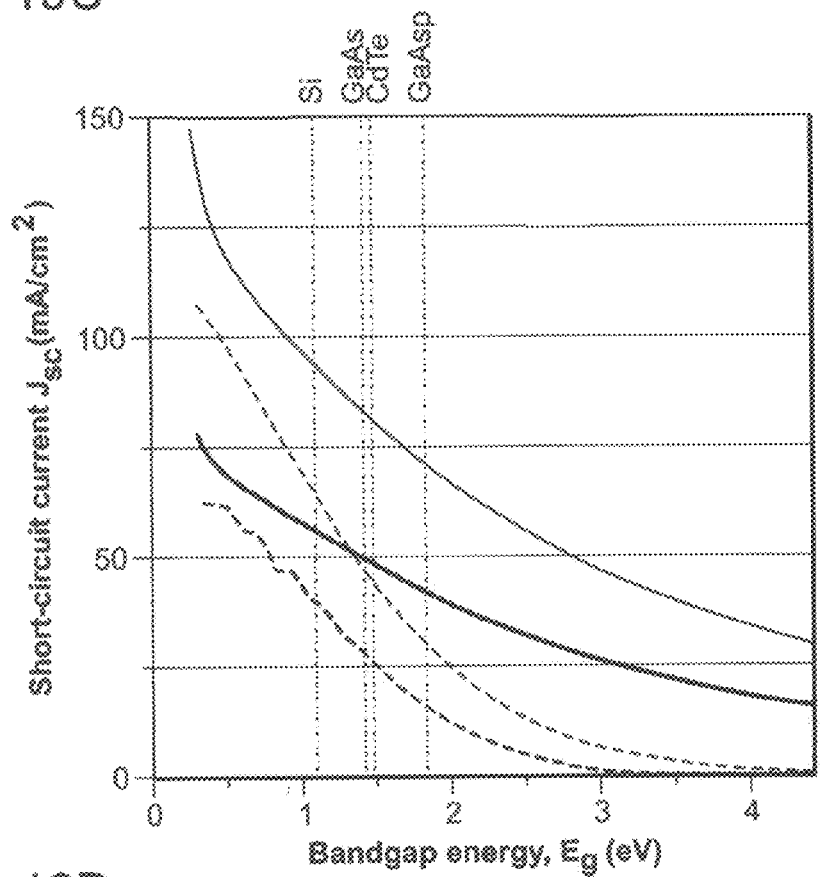
Figure 19D:
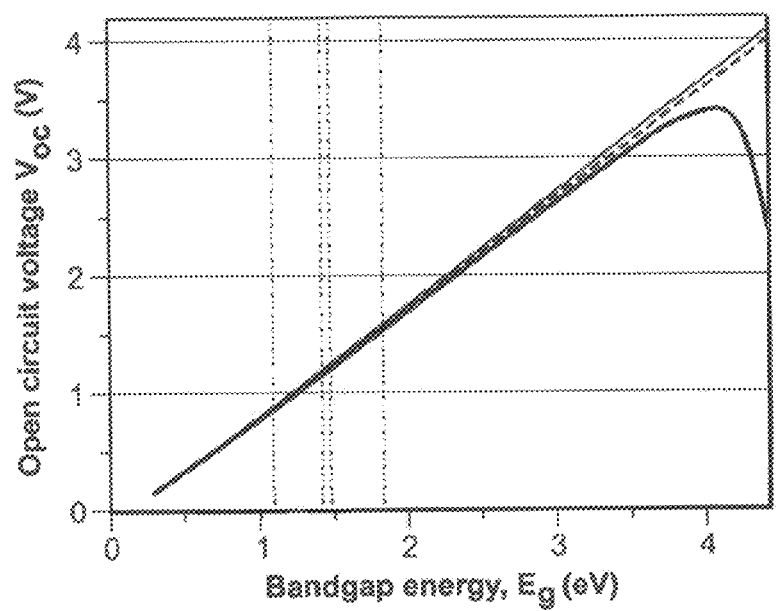

As illustrated in FIG. 18, the upconverter (System 2) absorbs incoming solar radiation through its illuminated front surface, and by reciprocity, can also emit within the same frequency range. The emission through the front surface is, however, restricted to the wavelength (see FIG. 16) and angular ranges overlapping those of the incoming solar spectrum (i.e., $\theta_s \leq \theta_u^F$), while the parasitic thermal radiation in the IR frequency range and at larger angles is suppressed. The back surface of the upconverter can emit and absorb only the above-bandgap radiation (see FIG. 16), and this radiation is angularly-isotropic ($\theta_u^B = \pi/2$).

To estimate the intrinsic efficiency limit of the proposed hybrid thermo-photovoltaic platform we performed the detailed balance calculations based on solving the energy & photon current balance equations of (i) solar energy absorption in the upconverter and the PV cell, (ii) thermal re-emission through the upconverter selective surfaces, (iii) photon absorption and generation of the electron-hole pairs in the PV cell, (iv) radiative recombination of the electron-hole pairs and (v) absorption/re-emission of the portion of the resulting photons in the upconverter.

FIG. 18 is a schematic of the energy-balance model for a thermal upconverter with angularly- and spectrally-selective surfaces. The incoming energy flux of the below-bandgap photons ($I_s$) heats up the absorber, which emits the temperature-dependent thermal radiation through both surfaces with the frequency spectra determined by their emittance properties (see FIG. 11). The luminescence emission from the surface of the PV cell facing the upconverter ($I_c$) is also absorbed by the upconverter.

The equilibrium temperature of the upconverter ($T_u$) is determined through the energy balance calculations as follows:

$$I_{abs}^{E_m < E < E_g}(T_s, 0) + I_c^B(T_c, eV) = I_u^B(T_u, 0) + I_u^F(T_u, 0), \quad (11)$$

where the absorbed/emitted energy fluxes (defined via Eq. 1) are the function of the temperatures of the sun ($T_s$), the upconverter ($T_u$), and the PV cell ($T_c$), as well as of the angular- and spectral absorptance/emittance characteristics of the PV cell and the upconverter. The upconversion efficiency is defined as the ratio of the energy carried by the upconverter photons to the energy carried by all the below-gap photons incident on the upconverter:

$$\eta_u = I_u^B(T_u, 0) / I_s^{E < E_g}(T_s, 0). \quad (12)$$

Once the equilibrium temperature of the upconverter is obtained, the efficiency of the hybrid system can be calculated by using (9,10). In this case, however, the incoming photon flux in the formula for the charge current generated in the PV cell (5) includes both, the absorbed above-the-bandgap solar photons and the above-the-bandgap photons emitted from the back surface of the upconverter:

$$J = e \cdot (N_s^{E > E_g}(T_s, 0) + N_u^B(T_u, 0) - N_c^{out}(eV)). \quad (13)$$

Note that as both (11) and (13) contain $T_u$ and eV as parameters, they have to be solved simultaneously via an iterative process.

By solving numerically Eqs. 9-13, we can find the limiting efficiency of the proposed hybrid thermo-photovoltaic converter as a function of the PV cell bandgap energy $E_g$, the maximum energy of photons absorbed/emitted through the front surface of the upconverter $E_m$, the angular dependence of the emittance characteristics of the illuminated (front) surface of the upconverter $\theta_u^F$, and the optical concentration C. Obviously, the highest upconversion efficiency is reached in the case when $\theta_u^F = \theta_s$, so that all the incoming sunlight is absorbed while the emission is limited to the same angular range. This can be achieved by enclosing the upconverter into a reflective cavity described above with the angular aperture of $\theta_s$. Note that if the emission from the front surface of the PV cell is also limited to the same angular range, the emission due to radiative recombination from that surface is also minimized.

FIG. 19 shows the maximum efficiency and the I-V characteristics of the hybrid energy converter as a function of the PV cell bandgap energy in the ideal case; $\theta_u^F = \theta_c^F = \theta_s = 0.267°$, $E_m = E_s^{min} = 0.31$ eV, $\alpha_1^F = \alpha_1^B = \alpha_c = 1$, $\alpha_2^F = \alpha_3^F = \alpha_2^B = 0$, C=1. FIG. 19 (a) shows the efficiency of the hybrid converter for the AM1.5D solar spectrum (red) and a 6000K blackbody solar spectrum (blue). The corresponding efficiency plots for a single-junction PV cell (Shockley-Queisser efficiency) are shown as dashed lines for comparison. The dotted lines mark the bandgap energies of several popular PV materials (labeled on top). (b) Equilibrium temperature of the upconverter and the upconversion efficiency (12). (c) The short circuit current and (d) the open circuit voltage of the PV cell (dash) and the hybrid device (solid).

FIG. 19 shows that the maximum efficiency of the proposed hybrid device can reach 76% if the solar spectrum is approximated as a blackbody spectrum at 6000K temperature (blue lines in FIG. 19a) and 73% for the terrestrial AM1.5D spectrum. The efficiency maxima are reached at much higher bandgap energy values than those for a single PV cell (shown as dashed lines). However, the hybrid device efficiency is significantly improved over that of the PV cell in the whole range of bandgap energy values. As seen from FIG. 19b, the higher efficiency values are reached at higher values of upconverter temperature. Nevertheless, for the PV materials of practical interest, the upconverter temperature stays within 100-1600K range. As the thermal radiation from the upconverter increases with the increase of its temperature, the upconversion efficiency drops simultaneously (FIG. 19b). FIGS. 19c,d show that while the open circuit voltage $V_{OC}$ of the hybrid device is not noticeably different from that of the individual PV cell, the short circuit current $J_{SC}$ is much higher, resulting in the higher output power of the device. $V_{OC}$ and $J_{SC}$ can be calculated from (13) assuming $J(eV_{OC})=0$ or $J_{SC}=J(eV=0)$, respectively. It should be noted that the use of the approximate 6000K solar spectrum results in the overestimation of the short circuit current, and deviations of the efficiency plots from those obtained by using the actual terrestrial direct solar spectrum. In the following, only the data obtained by using the AM1.5D spectrum are presented.

Figure 20A:
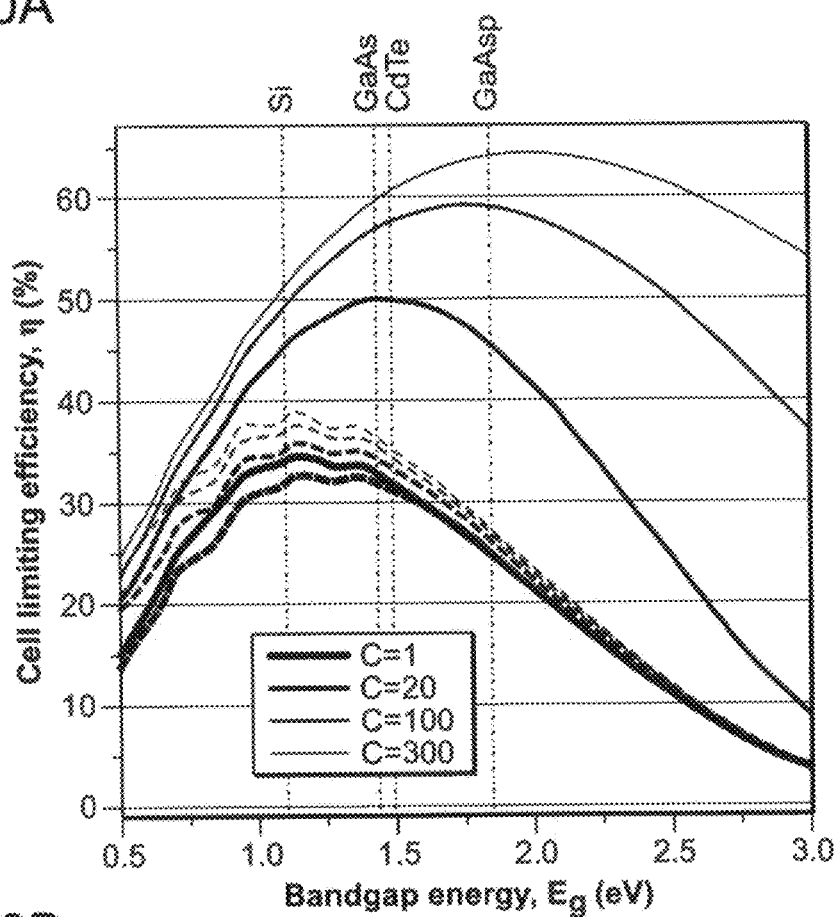
FIGS. 20a and b are graphs illustrating the efficiency of the hybrid energy converter disclosed herein as a function of the PV cell bandgap energy and optical concentration.
Figure 20B:
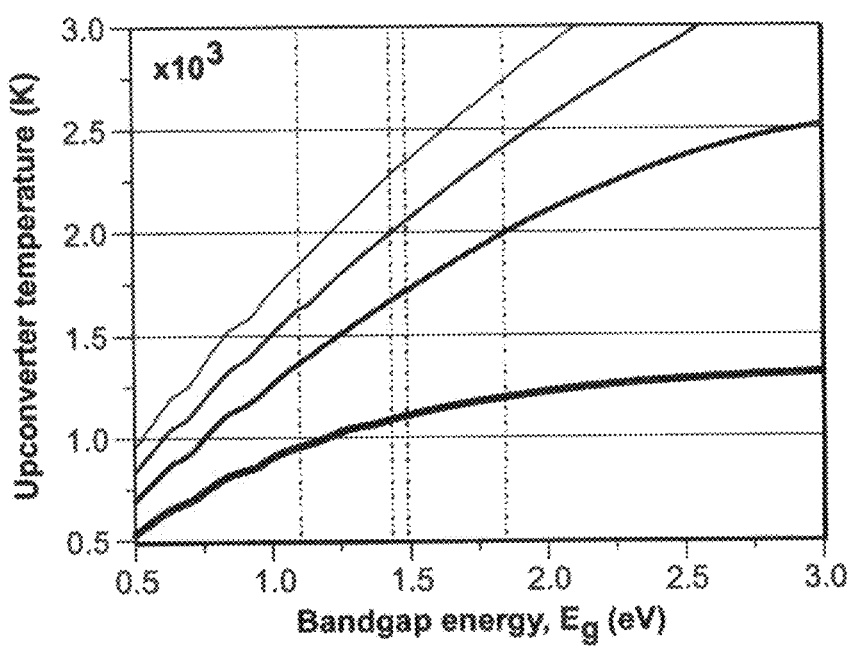

We will now estimate the performance of the proposed hybrid device under more realistic less-than-optimum conditions. FIG. 20 shows the device efficiency in the case when $\theta_u^F = 5°$, $\theta_c^F = \pi/2$ (i.e., only the upconverter is enclosed in a reflective cavity with 5-degrees aperture). For the illumination with the unconcentrated sunlight the efficiency drops significantly from the ideal case (which corresponds to the maximum optical concentration), while still remains higher than the S-Q limit for the isolated PV cell (blue lines in FIG. 20b). The radiation losses through the angular aperture can be overcome by using optical concentration, although this also increases the operating temperature of the upconverter (FIG. 20b). Still for Si cell, 50% efficiency is achieved for reasonable temperatures of about 1600K.

Figure 21A:
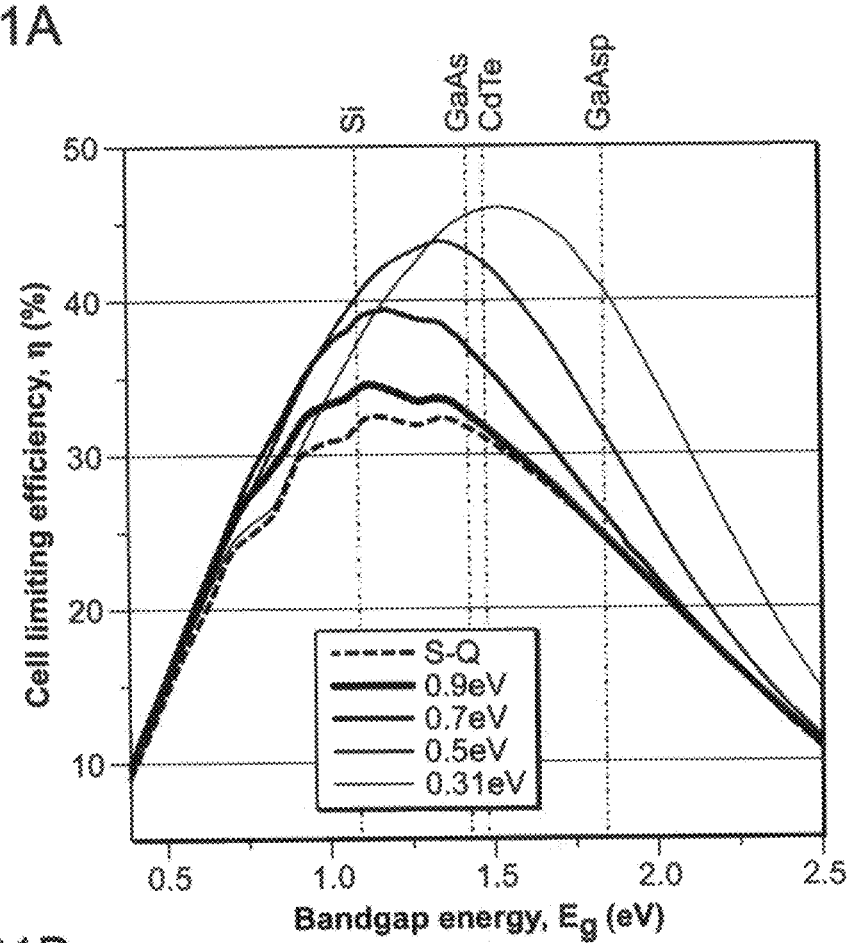
FIGS. 21a and b are graphs illustrating the efficiency of the hybrid energy converter as a function of the PV cell bandgap energy and the spectral characteristics of the up converter surface absorbance/emittance.
Figure 21B:
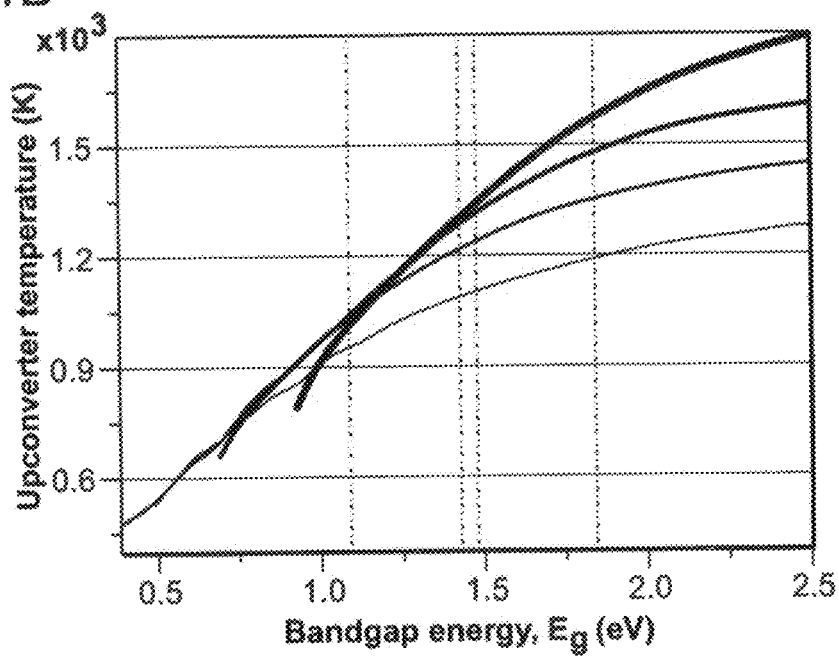

As already discussed in the introduction, another parameter that can be tuned to increase the device efficiency, is the spectral dependence of the surface absorptance/emittance, i.e., the cut-off energy $E_m$ (see FIG. 16). FIG. 21 demonstrates that even for the illumination with the unconcentrated sunlight (C=1), the efficiency of the device can be increased by optimizing the value of the absorptance/emittance cut-off energy $E_m$. The increase of $E_m$ limits the emittance range and thus reduces the parasitic thermal emission from the thermal upconverter. It also blue-shifts the peak efficiency values (FIG. 21a) and increases the temperature of the upconverter (FIG. 21b).

FIG. 20 (a) shows the efficiency of the hybrid energy converter as a function of the PV cell bandgap energy and the optical concentration ($\theta_u^F = 5°$, $\theta_c^F = 90°$, $E_m = E_s^{min} = 0.31$ eV, $\alpha_1^F = \alpha_1^B = \alpha_c = 1$, $\alpha_2^F = \alpha_3^F = \alpha_2^B = 0$). The corresponding efficiency plots for a single-junction PV cell (Shockley-Queisser efficiency) are shown as dashed lines for comparison. The dotted lines mark the bandgap energies of several popular PV materials (labeled on top). FIG. 20 (b) shows equilibrium temperature of the upconverter.

In FIGS. 19-21, it was assumed that the upconverter has a 100% absorptance ($\alpha_1^F = \alpha_1^B = 1$) within its absorption windows (i.e., for $E_m < E < E_g$ on the front surface, and $E > E_g$ on its back surface), and is perfectly transparent outside this energy range ($\alpha_2^F = \alpha_3^F = \alpha_2^B = 0$). Real materials, however, have limited absorptance/emittance across the whole energy range, and it's important to estimate the effect of imperfect absorption of upconverter on the hybrid device efficiency.

FIG. 21 (a) shows the efficiency of the hybrid energy converter as a function of the PV cell bandgap energy and the spectral characteristics of the upconverter surface absorptance/emittance ($\theta_u^F = 5°$, $\theta_c^F = 90°$, $\alpha_1^F = \alpha_1^B = \alpha_c = 1$, $\alpha_2^F = \alpha_3^F = \alpha_2^B = 0$, C=1). The corresponding efficiency plot for a single-junction PV cell (Shockley-Queisser efficiency) is shown as a dashed grey line for comparison. The dotted lines mark the bandgap energies of several popular PV materials (labeled on top). FIG. 21 (b) shows equilibrium temperature of the upconverter.

FIG. 22 investigates the performance of the hybrid device as a function of the losses due to imperfect absorption/emission characteristics of the upconverter surfaces. The labels in FIG. 22 indicate the ratio of absorptance values (in %) within the upconverter absorption windows (see FIG. 16) and emittance within the photon energy ranges where emission should be blocked (i.e., the plots of the device with ideal absorptance/emittance characteristics are labeled as 100/0). Clearly, the increased losses reduce the efficiency of the device. The losses can be partially compensated by the optical concentration (300 suns in FIG. 22), and for the upconverter losses level 856/15 the hybrid device still out-performs the isolated PV cell (shown as dashed line in FIG. 22a).

Figure 22A:
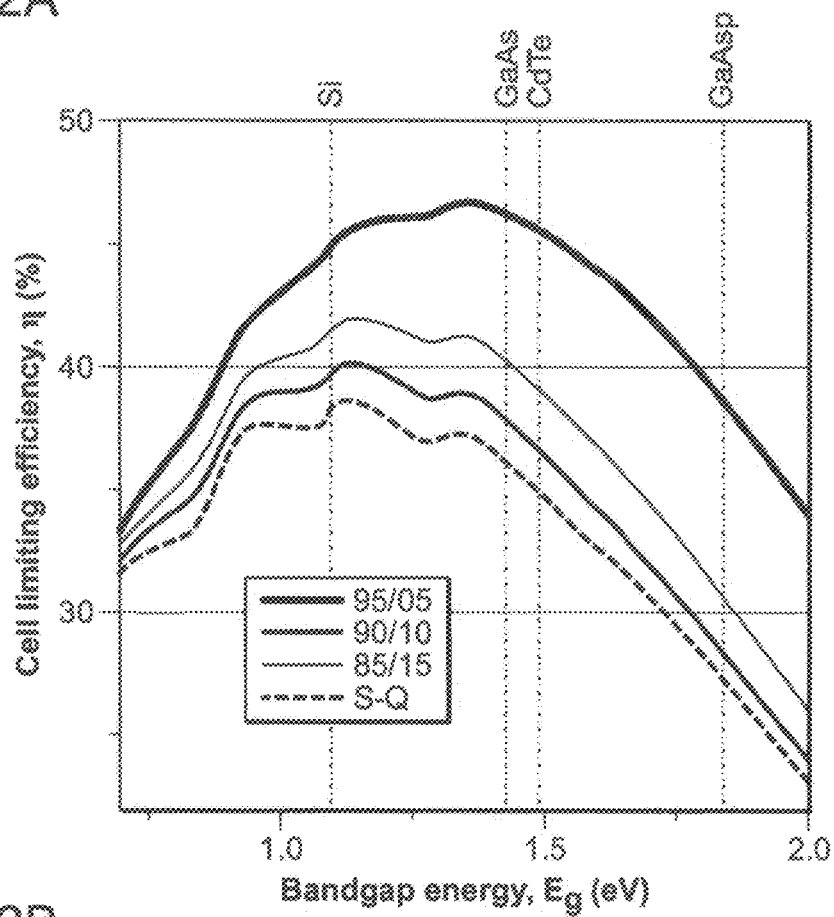
FIGS. 22a, b, c and d are graphs illustrating the efficiency of the hybrid energy converter disclosed herein as a function of the PV cell bandgap energy and level of radiation losses due to non-ideal absorbance/emittance characteristics of the up converter surfaces.
Figure 22B:
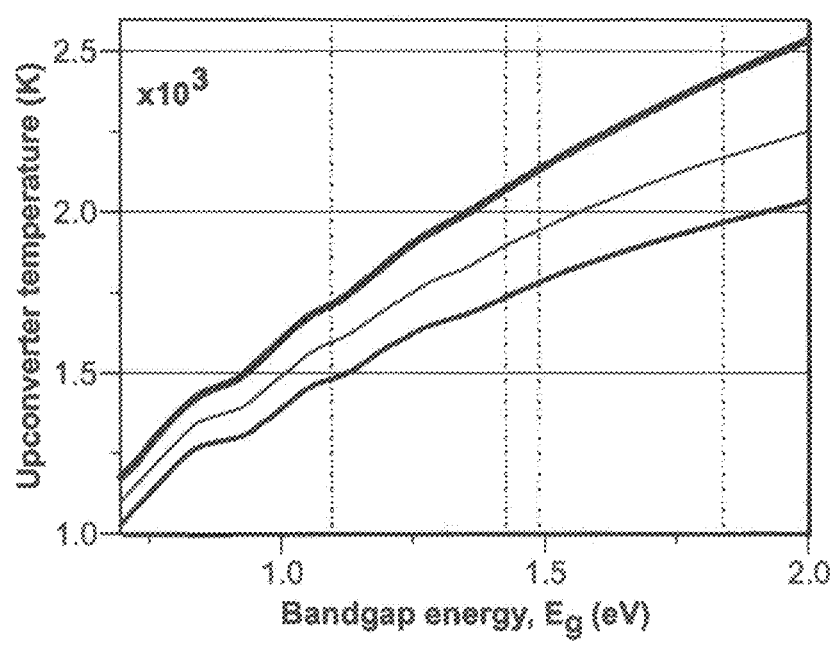
Figure 22C:
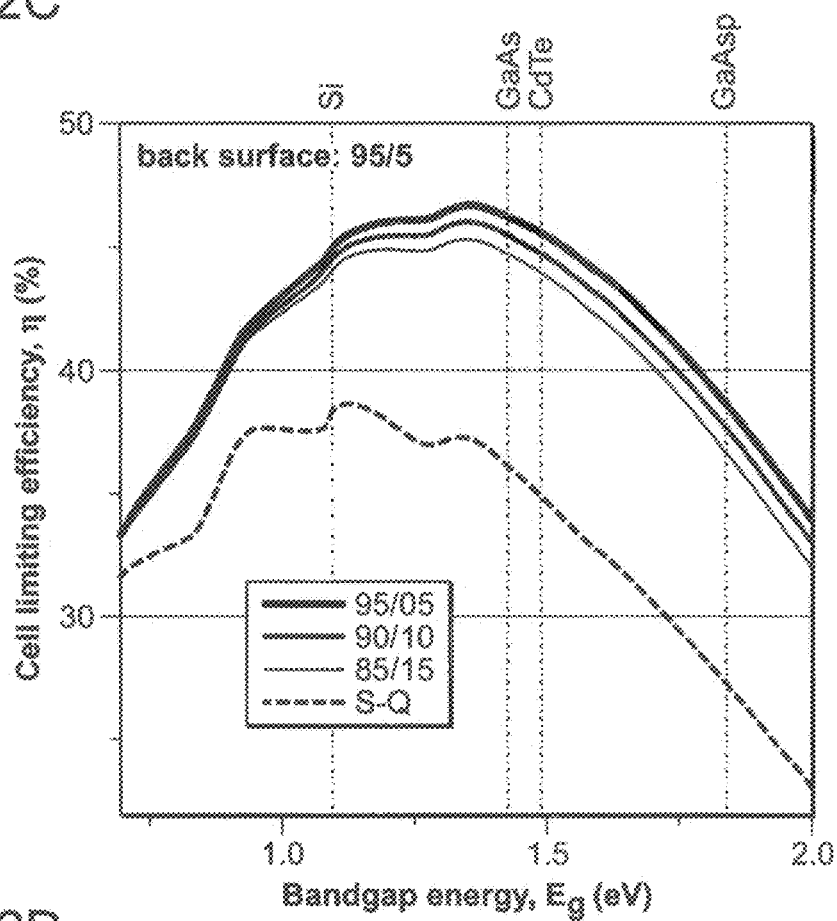
Figure 22D:
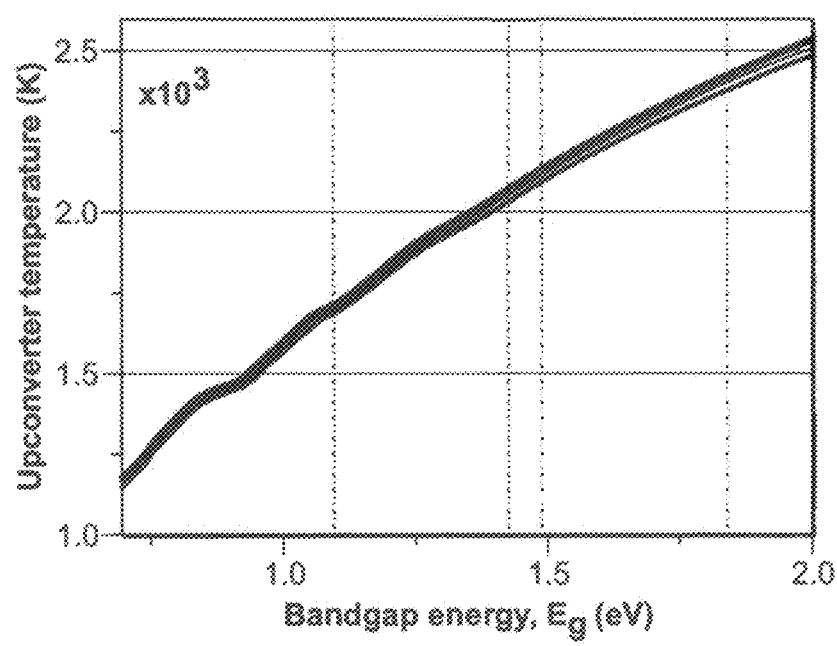

A close inspection of the emission losses reveals that the strongest efficiency decline results from the losses through the upconverter back surface, which is characterized by angularly-isotropic emittance. The losses through the front surface on the other hand, are significantly reduced owing to angular selectivity of this surface. FIG. 22c shows the effect of the progressively increased losses through the front surface of the upconverter, when the losses at the back surface are kept at 95/5 limit. Clearly, even for the front surface spectral characteristics that are quite far from ideal 100/0, the overall high efficiency of the device is maintained provided the back surface losses are kept under better control (e.g., kept at the level 95/5).

Summarizing, a detailed analysis of non-ideal solar cells that allows for up to 15% of absorption/re-emission losses yields limiting efficiency values of the hybrid device exceeding 45%. The temperature at which the upconverter reaches equilibrium grows with the bandgap energy and the optical concentration limit, and becomes impractically high for GaAs and larger-bandgap PV cell materials (FIGS. 22b,d). However, for the Si solar cell, the upconverter operating temperature remains below 1700K.

The numbers in square brackets refer to the references listed herein. The contents of all of these references are incorporated herein by reference in their entirety.

It is recognized that modifications and variations of the present invention will be apparent to those of ordinary skill in the art and it is intended that all such modifications and variations be included within the scope of the appended claims.

What is claimed is:

1. Solar power conversion system comprising:
a cavity having a diameter and maintained at a pressure below atmospheric pressure formed within an enclosure having specularly reflecting inside walls, the enclosure having an opening or a window to receive solar radiation and wherein the enclosure has a spherical, ellipsoidal or cylindrical geometry; and
an absorber including at least one surface exposed to the solar radiation patterned with micro and/or nanoscale features to improve absorption and/or emission characteristics and having a width enclosed within the cavity at approximately the center of the cavity for receiving the solar radiation resulting in heating of the absorber wherein the ratio of the diameter of the cavity to the width of the absorber is selected to maintain effective infrared emittance in a 2% to 5% range.

2. The system of claim 1 wherein bandwidth of specular reflectivity of the inside walls includes an emission spectrum of the absorber.

3. The system of claim 1 wherein the absorber is absorptive to solar radiation but has a low emittance at its operational temperature.

4. The system of claim 1 wherein the absorber is a black body on a surface that receives the solar radiation.

5. The system of claim 1 wherein the absorber has tailored absorption characteristics and is absorptive within a pre-designed frequency range covering only a part of the solar spectrum.

6. The system of claim 1 further including a device thermally linked to the absorber by heat conduction, convection or thermal radiation.

7. The system of claim 6 wherein the device is a thermoelectric generator.

8. The system of claim 6 wherein the device emits electrons.

9. The system of claim 6 wherein the device is a heat exchange fluid (including a nanofluid or a molten salt) or a heat engine.

10. The system of claim 6 wherein the device is a phase-changing material capable of heat storage.

11. The system of claim 6 including a combination of both energy generators and heat storage systems described in claims 7, 8, 9, and 10.

12. The system of claim 6 wherein the device is a thermal battery.

* * * * *